(12) United States Patent
So

(10) Patent No.: US 10,716,225 B1
(45) Date of Patent: Jul. 14, 2020

(54) DATA STORAGE DEVICES AND CONNECTORS FOR SAME

(71) Applicant: WESTERN DIGITAL TECHNOLOGIES, INC., San Jose, CA (US)

(72) Inventor: Kin Ming So, Hong Kong (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/457,134

(22) Filed: Jun. 28, 2019

(30) Foreign Application Priority Data

Jun. 26, 2019 (CN) .......................... 2019 1 0560728

(51) Int. Cl.
| | | |
|---|---|---|
| *H05K 5/00* | (2006.01) | |
| *H05K 5/03* | (2006.01) | |
| *G06F 13/38* | (2006.01) | |
| *H05K 5/02* | (2006.01) | |

(52) U.S. Cl.
CPC ......... *H05K 5/0026* (2013.01); *G06F 13/382* (2013.01); *H05K 5/0239* (2013.01); *H05K 5/03* (2013.01); *G06F 2213/0042* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,178,096 B1 * | 1/2001 | Flickinger | ............ | H05K 9/0058 206/719 |
| 6,490,163 B1 * | 12/2002 | Pua | ...................... | H05K 5/0278 174/250 |
| 7,035,110 B1 * | 4/2006 | Wang | ................... | H05K 5/0278 361/737 |
| 7,095,617 B1 * | 8/2006 | Ni | ........................ | H05K 5/0278 361/736 |
| 7,301,776 B1 * | 11/2007 | Wang | .................. | G06F 12/1416 360/137 |
| 7,518,879 B2 * | 4/2009 | Chung | ................. | H05K 5/0278 174/255 |

(Continued)

FOREIGN PATENT DOCUMENTS

| | | |
|---|---|---|
| CN | 203849999 U | 9/2014 |
| CN | 106025618 A | 10/2016 |

OTHER PUBLICATIONS

"DX07 Series" I/O Connector Compatible with the Next Generation USB Type-CTM Specification Has Been Developed. JAE. https://www.jae.com/en/releasesE/news-201504DX07-en.html. Downloaded Jan. 10, 2018.

(Continued)

*Primary Examiner* — Lisa Lea-Edmonds
(74) *Attorney, Agent, or Firm* — Brinks Gilson & Lione

(57) ABSTRACT

A storage device includes a circuit board configured to store data and a connector mounted horizontally to the first surface of the circuit board. The connector comprises an insertion portion configured to be inserted into a port of an electronic device and a connection portion connected to the circuit board. An offset thickness between a thickness of the connection portion and a thickness of the insertion portion is at least 1 millimeter (mm). The storage device also comprises a housing enclosing the circuit board. A length of the housing does not exceed 8 mm.

20 Claims, 13 Drawing Sheets

(56) References Cited

U.S. PATENT DOCUMENTS

| | | | | |
|---|---|---|---|---|
| 7,554,814 | B2* | 6/2009 | Chen | H05K 5/0278 361/737 |
| 7,708,570 | B2* | 5/2010 | Ni | G06F 13/4063 439/131 |
| 7,802,997 | B2* | 9/2010 | Kuo | H01R 13/6658 361/737 |
| 7,869,219 | B2* | 1/2011 | Ma | G11C 11/5621 361/737 |
| 7,876,555 | B2* | 1/2011 | Kung | G06K 7/0013 361/679.31 |
| 8,071,895 | B2* | 12/2011 | Shiu | H05K 3/284 174/521 |
| 8,102,662 | B2* | 1/2012 | Hiew | H05K 5/0278 361/752 |
| 8,274,796 | B2* | 9/2012 | Kuster | G06F 12/0246 361/737 |
| 8,625,270 | B2* | 1/2014 | Ni | G06F 21/32 361/679.02 |
| 8,801,467 | B2 | 8/2014 | Lan | |
| 9,043,931 | B2* | 5/2015 | Moon | G06F 21/79 726/27 |
| 9,202,089 | B2* | 12/2015 | Yang | G06K 7/0004 |
| 9,471,104 | B2* | 10/2016 | Chiu | G06F 1/1632 |
| 9,577,382 | B2 | 2/2017 | Kida | |
| 10,402,140 | B2* | 9/2019 | Mazurek | G06F 11/0751 |
| 2008/0089020 | A1* | 4/2008 | Hiew | H05K 9/0067 361/679.31 |
| 2008/0144270 | A1* | 6/2008 | Dal Porto | H05K 5/0278 361/679.31 |
| 2008/0232060 | A1* | 9/2008 | Yu | G06K 19/07732 361/731 |
| 2008/0276099 | A1* | 11/2008 | Nguyen | G06F 12/1416 713/186 |
| 2009/0190277 | A1* | 7/2009 | Hiew | G06F 1/1632 361/56 |
| 2011/0007464 | A1* | 1/2011 | Leigh | H01R 9/2408 361/679.01 |
| 2011/0300752 | A1* | 12/2011 | Chou | H05K 5/0278 439/620.21 |
| 2013/0109235 | A1 | 5/2013 | Chou et al. | |
| 2013/0118783 | A1 | 5/2013 | Huang | |
| 2014/0211407 | A1* | 7/2014 | Huang | H05K 5/0278 361/679.32 |
| 2015/0131245 | A1* | 5/2015 | Amini | H05K 1/0296 361/760 |
| 2015/0227176 | A1* | 8/2015 | Johnson | H01R 13/501 361/679.32 |
| 2016/0098066 | A1* | 4/2016 | Huang | G06F 1/181 361/679.32 |
| 2016/0371218 | A1* | 12/2016 | Roberts-Hoffman | G06F 12/0246 |

OTHER PUBLICATIONS

GCT USB Type C Connector. https://gct.co/usb-connector/usb-type-c. Downloaded Jan. 10, 2018.
GCT USB4065—Type C USB 3.1 Connector. https://gct.co/connector/usb4065#.WakevmnFpg. Downloaded Jan. 10, 2018.
Kycon. Universal Serial Bus: KUSBVX-SMT Series USB Type C Socket, Vertical Mount, SMT Contacts. http://www.kycon.com/2013Catalogpage/USB/KUSBVX-SMT.pdf.
U.S. Appl. No. 16/282,068, filed Feb. 21, 2019, So.
GCT Micro USB Connector (USB2.0). Micro USB Connector 2.0 Mount Types—Vertical, Horizontal: Top mount, mid mount and bottom mount. https://www.gct.co/usb-connector/micro-usb-connector-overview. Downloaded on Jan. 10, 2018.
MPSI USB Connectors. http://mpsiconnex.com/index.php/products-services/connectors/usb-connectors/. MPSI Connex. MPSi Limited. Downloaded Jan. 10, 2018.
USB Type-C Connector "DX07 Slim Plug" Has Been Developed. JAE electronics. https://www.jae.com/en/releasesE/news-201512DX07slimplug-en.html. Downloaded Jan. 10, 2018.
Variation of USB Type-C DX07 Series Connectors Has Been Expanded. JAE. https://www.jae.com/en/releasesE/news-201702DX07-en.html. Downloaded Jan. 10, 2018.
Wurth Elektronik Right Angle USB 3.1 Type C USB Connector Receptacle Surface Mount, Through Hole. https://za.rs-online.com/web/p/connettori-usb-tipo-c/1225151/ Downloaded Jan. 10, 2018.

\* cited by examiner

DATA STORAGE DEVICES AND CONNECTORS FOR SAME

BACKGROUND

Field

This disclosure relates to storage devices and connectors for the same. In particular, this disclosure relates to data storage devices and connectors for the same having a low profile or small form factor.

Description

Data storage devices, such as portable data storage devices, are available in a variety of shapes and sizes. For example, larger data storage devices can include portable hard disk drives or solid state drives, and smaller data storage devices can include flash drives.

Typically, data storage devices include a connector adapted to allow the data storage device to be connected to a port of another device, such as a computer, laptop, smartphone, etc. In general, different types of connectors are available for connecting to different types of ports.

SUMMARY

The present disclosure generally relates to, for example, a type-C USB (Universal Serial Bus) memory drive or storage device with a small size. The storage device can be configured for plug-and-stay use. The storage device can include a USB SiP (System-In-Package) or other type of circuit board positioned within a housing and a USB type-C connector that is horizontally mounted to the USB SiP or other type of circuit board.

In a first aspect, a storage device is disclosed. The storage device includes a circuit board configured to store data, the circuit board including a first surface. The storage device also includes a connector mounted horizontally to the first surface of the circuit board such that an insertion axis of the connector is substantially parallel to the first surface of the circuit board. The connector comprises an insertion portion configured to be inserted along the insertion axis of the connector into a port of an electronic device and a connection portion connected to the first surface of the circuit board. An offset thickness between a thickness of the connection portion and a thickness of the insertion portion is at least 1 millimeter (mm). The storage device also comprises a housing enclosing the circuit board and the connection portion of the connector. The insertion portion of the connector extends through an aperture in an inner side of the housing. A length of the housing, measured between the inner side of the housing and an outer side of the housing, does not exceed 8 mm, the outer side positioned opposite the inner side along the length.

The storage device can optionally include one or more of the following features, in any combination: (a) wherein the circuit board comprises a thickness measured between the first surface and a second surface opposite the first surface, and the thickness of the circuit board is approximately equal to the offset thickness; (b) wherein the connection portion of the connector comprises twenty-two pins attached to the circuit board, and the storage device is configured to transfer data at least 10 gigabits per second (Gbps) using the twenty-two pins; (c) wherein the twenty-two pins are connected to the circuit board in a first row comprising twelve pins and a second row comprising ten pins; (d) wherein the first row of pins are staggered with respect to the second row of pins such that the first row of pins and second row of pins are not aligned in a direction parallel to the insertion axis; (e) wherein the circuit board comprises a length of about 5 mm, and the housing comprises a length of about 5.8 mm; (f) wherein the circuit board comprises a length of about 7 mm, and the housing comprises a length of about 7.8 mm; (g) wherein a length of the insertion portion of the connector is about 7.4 mm; (h) wherein the housing comprises a first housing component including the inner side of the housing and at least partially surrounding the circuit board, wherein the first housing component comprises a heat conductive material configured to transfer heat, and a second housing component at least partially surrounding the first housing component, the second housing component comprising a heat insulative material configured to inhibit transfer of heat; (i) wherein the inner side of the first housing component is configured to directly contact a surface of the electronic device to provide heat transfer between the inner side of the first housing and the electronic device; (j) the first housing component comprises a first bridging wall positioned above the connection portion of the connector, and a second bridging wall positioned below the circuit board; (k) wherein the second housing component includes a flange for securing the circuit board; (l) wherein the connector comprises a universal serial bus (USB) type-C connector; and/or (m) wherein the circuit board comprises a system-in-package (SiP) comprising a plurality of integrated circuits.

In another aspect, a storage device is disclosed that includes a circuit board configured to store data. The circuit board comprises a temperature sensor configured to measure a temperature of the circuit board and a data transfer rate controller based on the measured temperature. The storage device also includes a connector mounted horizontally the circuit board such that an insertion axis of the connector is substantially parallel the circuit board. The connector comprises an insertion portion configured to be inserted into a port of an electronic device and a connection portion connected to the circuit board. The storage device comprises a housing enclosing the circuit board and the connection portion of the connector. The insertion portion of the connector extends through an aperture in an inner side of the housing. A length of the housing, measured between the inner side of the housing and an outer side of the housing, does not exceed 8 millimeters (mm).

The storage device can optionally include one or more of the following features, in any combination: (a) wherein an offset thickness between a thickness of the connection portion and a thickness of the insertion portion is at least 1 mm; (b) wherein the housing comprises a first housing component including the inner side of the housing and at least partially surrounding the circuit board, wherein the first housing component comprises a heat conductive material configured to transfer heat, and a second housing component at least partially surrounding the first housing component, the second housing component comprising a heat insulative material, wherein the inner side of the first housing component is configured to directly contact a surface of the electronic device to provide heat transfer between the inner side of the first housing component and the electronic device; (c) wherein the first housing component is die cast; (d) wherein the connector comprises a universal serial bus (USB) type-C connector; and/or (e) wherein the circuit board comprises a system-in-package (SiP) comprising a plurality of integrated circuits.

In another aspect, a storage device is disclosed that includes a storing means for storing data, the storing means comprising a top surface, a housing means for housing the storing means, and a connector means for connecting to an electronic device to transfer data between the storing means and the electronic device. The connector means is mounted horizontally to the top surface of the storing means by an attachment means, the connector means extending through an aperture of the housing means. A length of the housing means, measured between an inner surface of the housing means and an outer surface of the housing means, does not exceed 8 millimeters (mm).

BRIEF DESCRIPTION OF THE DRAWINGS

Various embodiments are depicted in the accompanying drawings for illustrative purposes, and should in no way be interpreted as limiting the scope of the inventions. The drawings may not be to scale.

DETAILED DESCRIPTION

Figure 1:
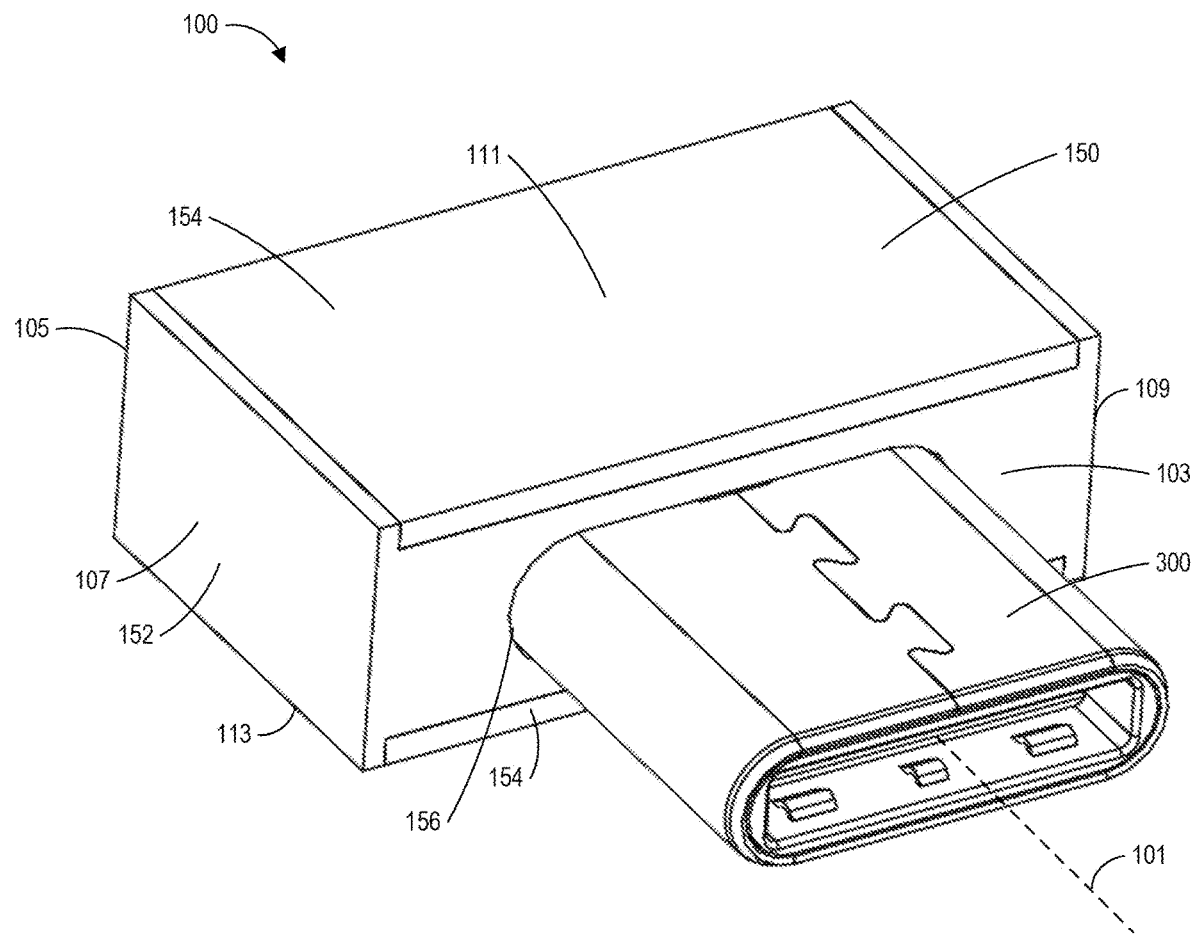
FIG. 1 is an isometric view of an embodiment of a storage device including a connector horizontally mounted to a circuit board within a housing.

In the following detailed description, reference is made to the accompanying drawings. In the drawings, similar symbols typically identify similar components, unless context dictates otherwise. Thus, in some embodiments, part numbers can be used for similar components in multiple figures, or part numbers can vary from figure to figure. The illustrative embodiments described herein are not meant to be limiting. Other embodiments can be utilized, and other changes can be made, without departing from the spirit or scope of the subject matter presented. It will be readily understood that the aspects of the present disclosure and illustrated in the figures, can be arranged, substituted, combined, and designed in a wide variety of different configurations by a person of ordinary skill in the art, all of which are made part of this disclosure.

Reference throughout this disclosure to "one embodiment," "an embodiment," or "in some embodiments" means that a particular feature, structure, or characteristic described in connection with the embodiment is included in at least one embodiment. Moreover, the appearance of these or similar phrases throughout the specification does not necessarily all refer to the same embodiment, nor are separate or alternative embodiments necessarily mutually exclusive. Various features are described herein which can be exhibited by some embodiments and not by others.

FIGS. 1-4 illustrate various views of an embodiment of a storage device 100 including a connector 300 that is horizontally mounted to a circuit board 200 within a housing 150. The circuit board 200 is positioned within the housing 150, and thus not visible FIGS. 1, 2, and 3, but is shown, for example, in the exploded view of FIG. 4.

The storage device 100 can be a data storage device configured for the storage of data (store data), such as computer files. The storage device 100 can be a portable storage device. As will be described below, the storage device 100 is connectable to an electronic device (e.g., a desktop computer, a laptop computer, a tablet, a cellphone, an audio player, etc.) with the connector 300. A user may then transfer data between the storage device 100 and the electronic device. The storage device 100 can be used, for example, to provide data storage, to provide additional storage for the electronic device, or to transfer data between two or more electronic devices. Other uses for the storage device 100 are also possible.

The storage device 100 can be configured with a small (or low-profile) form factor or size. Example dimensions for the storage device 100 configured with small or low-profile form factors are described in detail below with reference to the top and side views of FIGS. 2 and 3. Configuring the storage device 100 to have a small form factor may provide a number of advantages. For example, when connected to an electronic device (e.g., when connected to a port of an electronic device), the degree to which the storage device 100 protrudes from the side of the electronic device can be limited. This may allow a user to leave the storage device 100 connected to (e.g., plugged into, attached to, etc.) the electronic device for an extended period of time. Thus, the storage device 100 can be considered a plug-and-stay device.

Many conventional storage devices protrude significantly from the sides of electronic devices to which they are attached. As a result, many users only connect conventional storage devices to electronic devices for short periods of time because the protrusion of the storage devices from the electronic devices can be awkward or unwieldy. For example, a user may generally connect a conventional storage device to an electronic device to transfer data to or from the conventional storage device and then may remove the conventional storage device when the data transfer is complete. Further, many users generally disconnect conventional storage devices from electronic devices before storing the electronic storage devices, for example, to enable the electronic storage device to fit within a case or bag or to protect the storage device. For example, a user may remove a conventional storage device from a laptop before placing the laptop into a laptop bag or backpack because, otherwise, the laptop may not fit within the bag or backpack or the protruding conventional storage device may be damaged during storage.

The storage device 100 described herein can be configured with a small or low-profile form factor that may alleviate one or more of these disadvantages of conventional storage devices. For example, the storage device 100 may not protrude significantly from the side of an electronic device to which it is attached. This may allow a user to leave the storage device 100 connected to the electronic device for extended periods of time or during storage of the electronic device. For example, a user may leave the storage device 100 connected to an electronic device continuously because the small form factor of the storage device 100 may not significantly interfere with the use of the electronic device when connected. Another advantage of the small form factor of the storage device 100 may be that, when the storage device 100 is not connected to any other device, it may not require minimal space for storage. For example, a user may desire to carry the storage device 100 in his or her pocket or bag. As such, a small form factor for the storage device 100 may be desirable as it will not require much space for storage.

Decreasing the size or form factor of the storage device 100 (for example, to the dimensions described below with reference to FIGS. 2 and 3), however, is not without technical difficulty. This can be especially true for devices, such as the storage device 100, that include connectors 300 that are horizontally mounted to circuit boards 200. When the connector 300 is horizontally mounted to the circuit board 200, the circuit board 200 extends in a plane that is parallel to the plane of the connector 300 (see FIG. 4). Because of this, the length of the circuit board 200 contributes to the overall length of the storage device 100, generally increasing the total distance that the storage device 100 protrudes from an electronic device when connected to the electronic device. In contrast, in storage devices that include vertically or perpendicularly mounted connectors, the thickness of the circuit board (which is generally a much shorter dimension than the length of the circuit board) contributes to the overall length of the storage device. As such, it can be technically difficult to develop a small form factor storage device 100 that includes a horizontally mounted connector 300.

Additionally, the small form factor of the storage device 100 can pose challenges for forming a mechanical and electrical connection between the circuit board 200 and the connector 300 that can withstand the forces and torques imparted on the device during use (e.g., during insertion or removal of the storage device 100 into the port of the electronic device). Further, as the size of the storage device 100 is decreased, it may become increasingly difficult to provide adequate heat dissipation for the storage device 100.

The storage device 100 described herein can be configured with a small form factor while addressing or overcoming one or more of these challenges. For example, the storage device 100 can be configured with a small form factor while using the connector 300 that is horizontally mounted to the circuit board 200, providing a sufficiently strong mechanical and electrical connection between the connector 300 and the circuit board 200, and/or providing sufficient heat dissipation.

FIG. 1 is an isometric view of the storage device 100. The connector 300 can extend from the housing 150 as shown. In the illustrated embodiment, the housing 150 comprises a first housing component 152 and a second housing component 154. The first housing component 152 is shown alone in FIGS. 11 and 12, and the second housing component 154 is shown alone in FIG. 13. In the assembled state, for example, as shown in FIG. 1, the first housing component 152 and the second housing component 154 provide the housing 150 with an enclosure. The circuit board 200 can be positioned within the enclosure of the housing 150 (see, e.g., FIGS. 14-16). The connector 300 can be connected to the circuit board 200 within the enclosure of the housing 150 and extend outwardly from the housing 150 through an aperture 156. The storage device 100 can be configured for insertion into the along an insertion axis 101 as shown.

In the illustrated embodiment, the housing 150 includes an inner side or surface 103, an outer side or surface 105, a first side or surface 107 (e.g., a right side surface), a second side or surface 109 (e.g., a left side surface), a third side or surface 111 (e.g., a top surface), and a fourth side or surface 113 (e.g., a bottom surface). The inner side 103 can be the surface configured to face towards the electronic device when the storage device 100 is connected to the electronic device. The connector 300 can extend from the inner side 103. The aperture 156 can be formed through the inner side 103 such that the connector 300 extends through the inner side 103. The outer side 105 can be opposite the inner side 103.

The second side 109 can be opposite the first side 107. The fourth side 113 can be opposite the third side 111. In the illustrated embodiment, the inner side 103, the outer side 105, the first side 107, the second side 109, the third side 111, and the fourth side 113 are each generally flat or planar. This, however, need not be the case in all embodiments. For example, one or more of the inner side 103, the outer side 105, the first side 107, the second side 109, the third side 111, and/or the fourth side 113 can comprise a non-flat or non-planar shape, such as a curved shape. Further, although the housing 150 has been illustrated with a generally rectangular shape in the figures, other shapes for the housing 150 are also possible.

In the illustrated embodiment, the inner side 103, the first side 107, and the second side 109 are formed on the first housing component 152, and the outer side 105, the third side 111, and the fourth side 113 are formed on the second housing component 154. Other arrangements are also possible.

As will be described below, the configuration of the housing 150, including the configuration of the first housing component 152 and the second housing component 154, can provide a structure which facilitates a strong and reliable mechanical and electrical connection between the circuit board 200 and the connector 300. For example, the housing 150 may provide a structure that strengthens the storage device 100 against the forces and torques imparted on the storage device 100 as it is inserted and or withdrawn from the electronic device. Additionally, the configuration of the housing 150, including the configuration of the first housing component 152 and the second housing component 154, can provide a structure which facilitates heat dissipation for the storage device as discussed below.

As noted previously, FIG. 1 illustrates that the connector 300 can extend from the inner side 103 of the housing 150. The connector 300 can be configured for connection to the electronic device. For example, the connector 300 can be configured to connect to a port of the electronic device. In the illustrated embodiment, the connector 300 is a USB type-C connector. In other embodiments, however, the connector 300 can be another type of connector. For example, in other embodiments, the connector 300 can be configured as a USB type-A connector, a USB type-B connector, a mini USB connector, a micro USB connector, a lightning connector, a thunderbolt connector, etc. In certain embodiments, a USB type-C connector (for example, as illustrated) may be preferred because use of a USB type-C may contribute to minimizing the small form factor of the storage device 100. An embodiment of the connector 300, which is configured as a USB type-C connector, is shown alone in FIGS. 5-7, which are described in more detail below.

Figure 2:
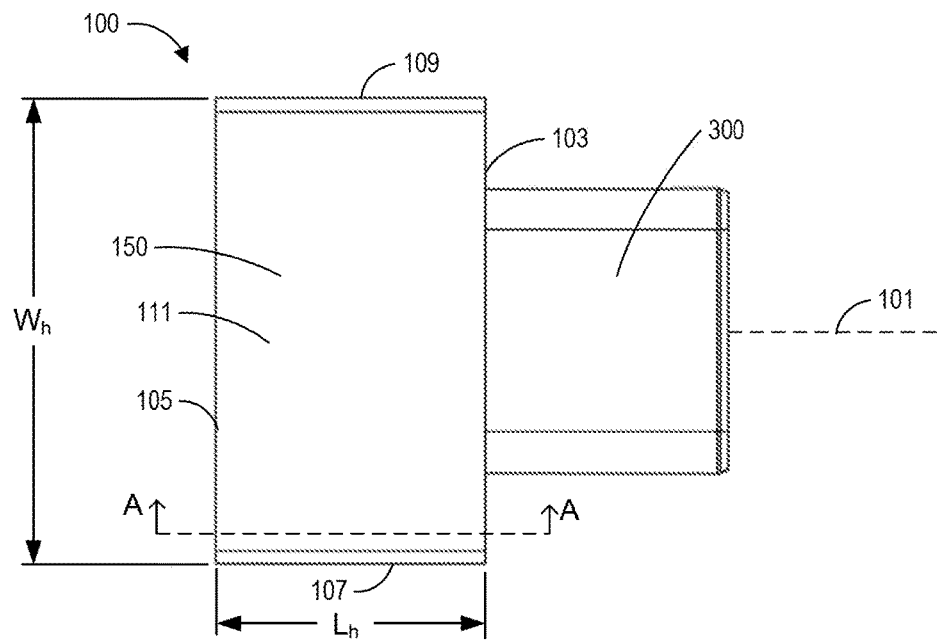
FIG. 2 is a top view of the storage device of FIG. 1.
Figure 3:
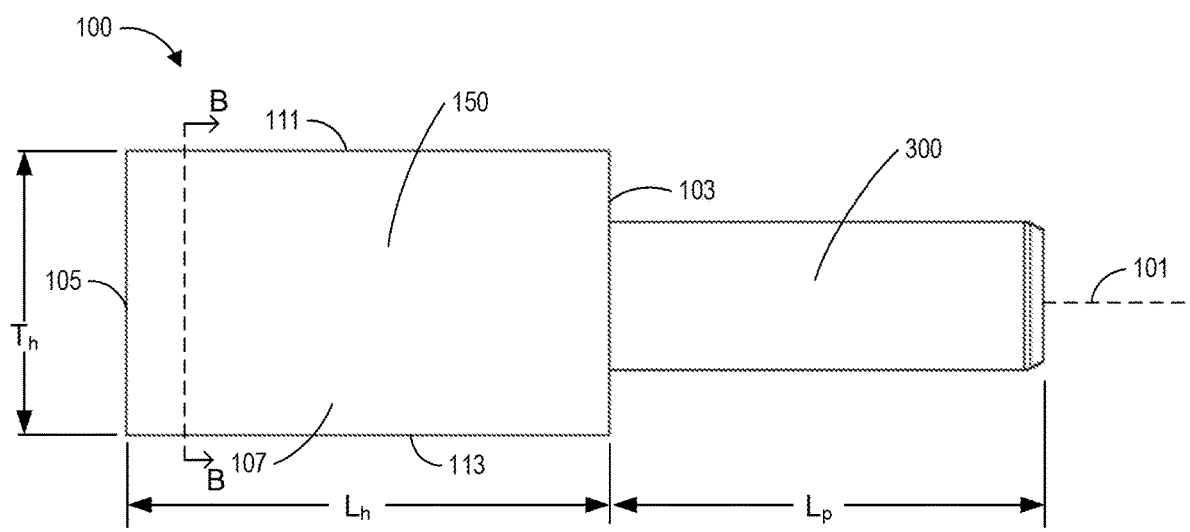
FIG. 3 is a right side view of the storage device of FIG. 1

FIG. 2 is a top view of the storage device 100, and FIG. 3 is a right side view of the storage device 100. Example dimensions for the storage device 100, having a small form factor or size, will be described with reference to FIGS. 2-3. As noted above, developing the storage device 100 with a connector 300 that is horizontally mounted to the circuit board 200, within the dimensions described here can be difficult, while still maintaining a sufficiently strong mechanical and electrical connection between the circuit board 200 and the connector 300 and providing adequate heat dissipation for the storage device 100. The storage device 100 described herein can include a sufficiently strong mechanical and electrical connection between the circuit board 200 and the connector 300 and provide adequate heat dissipation while remaining within the small form factor.

With reference to FIGS. 2 and 3, the housing 150 may comprise a length $L_h$, a width $W_h$, and a thickness $T_h$ as shown. The length $L_h$, the width $W_h$, and the thickness $T_h$ dimensions described below are configured to provide the housing 150 and/or the storage device 100 with a small or low-profile form factor. Further, the connector 300 may protrude from the housing 150 a length $L_p$ as shown.

As shown in FIGS. 2 and 3, a length $L_h$ can be measured between the inner side 103 and the outer side 105. As mentioned previously, the storage device 100 can be configured such that the inner side 103 faces towards the electronic device to which the storage device 100 is connected. In some embodiments, the inner side 103 contacts the electronic device. Accordingly, the length $L_h$ may be the distance that the housing 150 and/or the storage device 100 protrudes from the electronic device to which it is connected. In some embodiments, the length $L_h$ may be about 12 millimeters (mm), 10 mm, 8 mm, 6 mm, 5 mm, or 4 mm. In some embodiments, the length $L_h$ may not exceed about 12 mm, 10 mm, 8 mm, 6 mm, 5 mm, or 4.0 mm. In some embodiments, the length $L_h$ is between about 12 mm and about 3 mm, between about 10 mm and about 3 mm, between about 8 mm and about 3 mm, between about 6 mm and about 3 mm, between about 6 mm and about 4 mm, or between about 6 mm and about 5 mm. In an embodiment, the length $L_h$ is about 5.8 mm. In another embodiment, the length $L_h$ is about 7.8 mm. In another embodiment, the length $L_h$ is about 10.3 mm. For the storage device 100, the length $L_h$ can be minimized even though the connector 300 is mounted horizontally to the circuit board 200.

The width $W_h$ can be measured between the first side 107 and the second side 109 as shown in FIG. 2. In some embodiments, the width $W_h$ may be about 20 mm, 18 mm, 16 mm, 14 mm, 12 mm, or 10 mm. In some embodiments, the width $W_h$ may not exceed about 20 mm, 18 mm, 16 mm, 14 mm, 12 mm, or 10 mm. In some embodiments, the width $W_h$ is between about 20 mm and 10 mm, between 18 mm and 12 mm, between 16 mm and 12 mm, between 15 mm and 13 mm, between 14 mm and 13 mm. In an embodiment, width $W_h$ is about 13.5 mm.

As shown in FIG. 3, the thickness $T_h$ can be measured between the third side 111 and the fourth side 113. In some embodiments, the thickness $T_h$ may be about 8 mm, 7 mm, 6 mm, 5 mm, 4 mm, or 3 mm. In some embodiments, the thickness $T_h$ may not exceed about 8 mm, 7 mm, 6 mm, 5 mm, 4 mm, or 3 mm. In some embodiments, the thickness $T_h$ is between about 8 mm and 3 mm, between 7 mm and 4 mm, between 6 mm and 4 mm, or between 5 mm and 4 mm. In an embodiment, the thickness $T_h$ is about 4.6 mm.

Further, certain of the widths $W_h$ and thickness $T_h$ as described above can be in accordance with USB type-C specifications, which specify minimum distances between adjacent USB type-C ports. For example, the USB type-C specifications indicate that adjacent ports be at least 12.85 mm apart (spaced laterally) and 7 mm apart (spaced vertically) measured from the center point of the ports. To ensure that storage devices do not overlap and block adjacent ports, the widths $W_h$ and thickness $T_h$ of the devices must be limited. For conventional storage devices, this has resulted in increased lengths that cause the conventional storage device to protrude significantly from the sides of electronic devices. The storage device 100, in some embodiments, however, is configured to maintain sufficiently small widths $W_h$ and thickness $T_h$ so as to not block adjacent ports, while also maintaining a reduced length $L_h$, which limits the extent to which the storage device 100 protrudes from an electronic device to which it is attached.

As shown in FIG. 3, the connector 300 may protrude from the housing 150 the length $L_p$. The length $L_p$ can be about 12 mm, 10 mm, 8 mm, 7 mm, or 6 mm. In some embodiments, the length $L_p$ may not exceed about 12 mm, 10 mm, 8 mm, 7 mm, or 6 mm. In some embodiments, the length $L_p$ is between about 12 mm and about 6 mm, between about 10 and about 6 mm, between about 8 mm and about 6 mm, or between about 7 mm and about 6 mm. In an embodiment, the length $L_p$ is about 7.4 mm. In some preferred embodiments, the length $L_p$ is sufficiently short that the protruding portion of the connector 300 can be fully inserted into the port of the electronic device such that the inner side 103 of the housing 150 contacts the electronic device. As described below, this may facilitate heat dissipation for the device 100. This may also minimize the length $L_h$ that the housing 150 protrudes from the electronic device when the storage device 100 is inserted.

Figure 4:
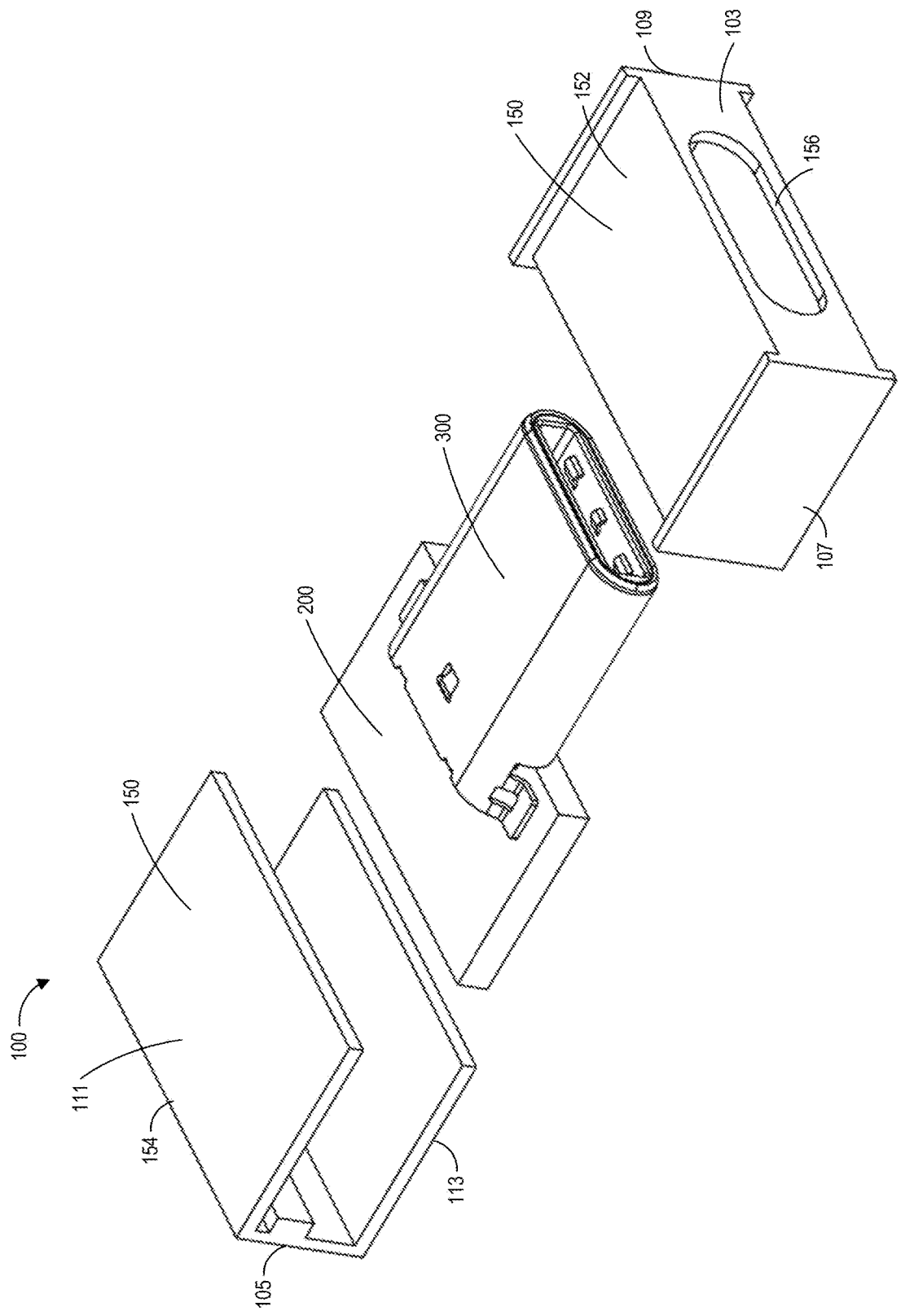
FIG. 4 is an exploded view of the storage device of FIG. 1, illustrating the connector horizontally mounted to the circuit board and first and second housing components.

FIG. 4 is an exploded view of the storage device 100, illustrating the connector 300 horizontally mounted to the circuit board 200 and first and second housing components 152, 154. As shown, the connector 300 can be horizontally mounted to the circuit board 200. As used herein, "horizontally mounted" refers to a configuration in which the connector 300 and the circuit board 200 lie generally in parallel planes. For example, a "horizontally mounted" connector can be positioned such that the insertion axis of the connector is substantially parallel to the surface which the connector is mounted.

In contrast, some storage devices include vertically mounted connectors, in which the connector and the circuit board lie in planes that are generally perpendicular to each other. One can envision that mounting the connector vertically may facilitate reduction of the length $L_h$ of the housing 150 (which corresponds to the distance the storage device 100 protrudes from the electronic device to which it is connected). In the case of a vertically mounted connector, the thickness of the circuit board (generally its smallest dimension) contributes to the length $L_h$ of the housing. In the storage device 100 as illustrated, however, the length Lb of the circuit board 200 (see FIG. 8) contributes to the length $L_h$ of the housing. Stated another way, the length $L_h$ of the housing 150 must be sufficient to accommodate the length Lb of the circuit board 200 when the connector 300 is horizontally mounted to the circuit board 200 as in the illustrated embodiment. Still, the storage device 100, including the horizontally mounted connector 300, can maintain a small form factor having the dimensions recited above with reference to FIGS. 2 and 3.

As shown in FIG. 4, the first and second housing components 152, 154 may be configured to surround and enclose the circuit board 200 such that the connector 300 extends through the aperture 156 of the first housing component 152. An embodiment of the connector 300 will be described with reference to FIGS. 5-7. An embodiment of the circuit board 200 will be described with reference to FIGS. 8 and 9. An embodiment of the first housing component 152 will be described with reference to FIGS. 11 and 12. An embodiment of the second housing component 154 will be described with reference to FIG. 13.

Figure 5:
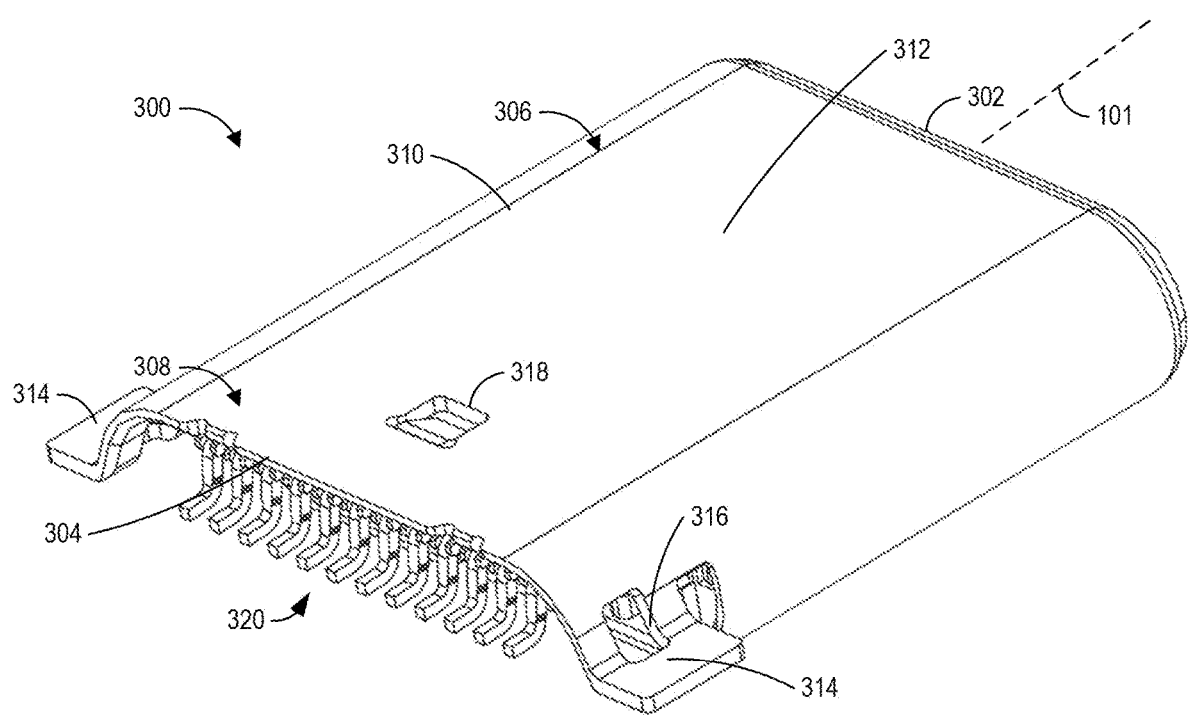
FIG. 5 is a perspective view of an embodiment of the connector of the storage device of FIG. 1.
Figure 6:
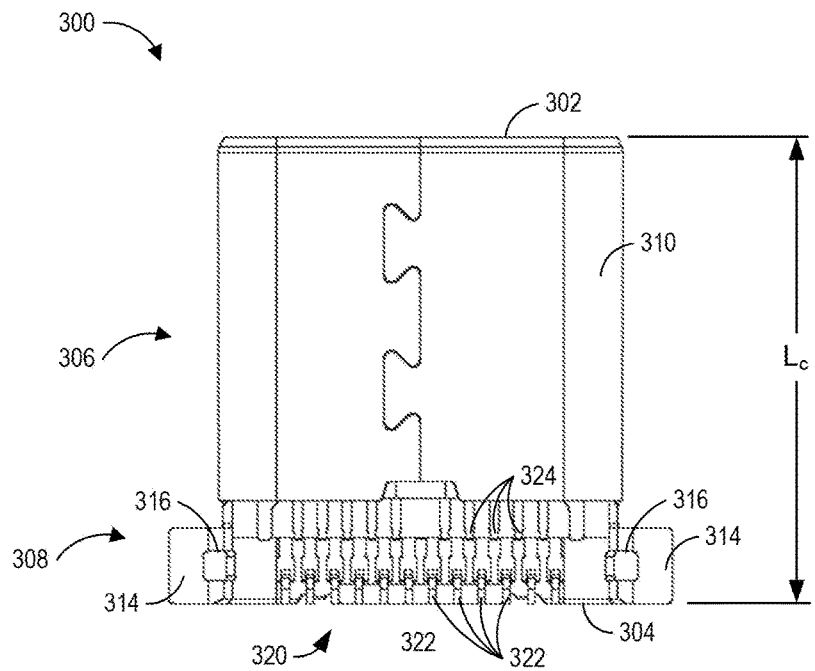
FIG. 6 is a bottom view of the connector of FIG. 5.
Figure 7:
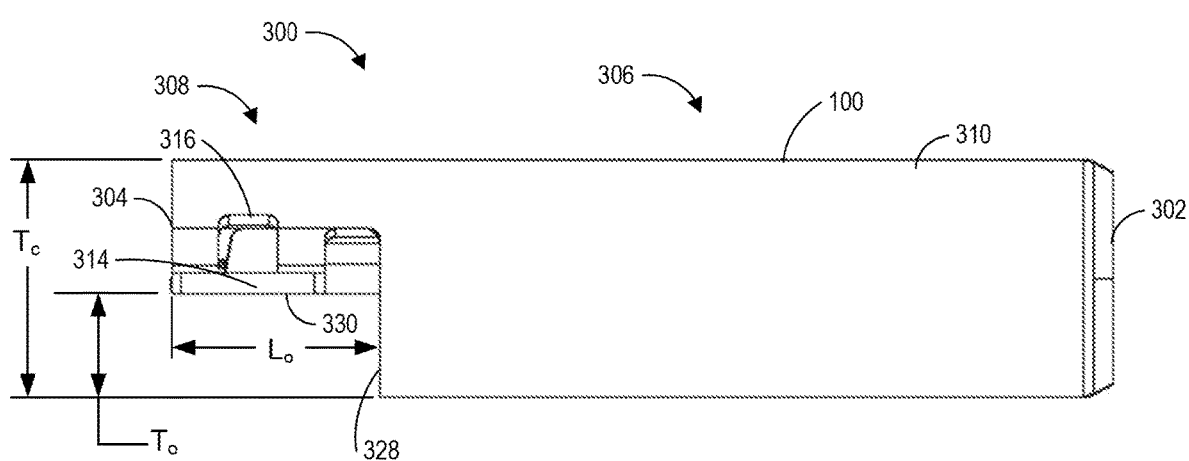
FIG. 7 is a side view of the connector of FIG. 5.

FIG. 5 is a perspective view of an embodiment of the connector 300, FIG. 6 is a bottom view of the connector 300, and FIG. 7 is a side view of the connector 300 of the storage device 100. As noted previously, in the illustrated embodiment, the connector 300 is a USB type-C connector. In other embodiments, however, the connector 300 can comprise other types of connectors. In certain embodiments, the USB type-C may be preferred because use of a USB type-C may contribute to minimizing the small form factor of the storage device 100. The connector 300 can extend along the insertion axis 101.

As illustrated, the connector 300 extends between a distal end 302 and a proximal end 304. The distal end 302 can be configured for insertion into a port of the electronic device to which the storage device 100 is attached. The proximal end 304 can be configured to connection to the circuit board 200 (see FIG. 10). The connector 300 can include an insertion portion 306 and a connection portion 308. The insertion portion 306 can be configured to be inserted into the port of the electronic device, and the connection portion 308 can be configured for attachment to the circuit board 200. The insertion portion 306 can comprise the portion of the connector 300 that extends outside the housing 150, and the connection portion 308 can comprise the portion of the connector 300 that is positioned within the housing 150 (see, for example, FIG. 14).

The insertion portion 306 can comprise a sheath 310. The sheath 310 can comprise a cross-sectional shape that is configured to be received within the port of the electronic device. The sheath 310 can also surround the internal components of the connector 300, such as the pins that establish an electrical connection between the circuit board 200 and the electronic device to which the storage device 100 is attached. The sheath 310 can include a flat upper surface 312. The flat upper surface 312 of the sheath 310 can provide a connection point for tooling that can hold and position the connector 300 during an assembly process. For example, in some embodiments, a suction tool may attach to the flat upper surface 312 of the sheath 310 to hold and position the connector 300 during assembly of the storage device 100.

Assembly of the storage device 100, and in particular, attachment of the connector 300 to the circuit board 200, may be one area in which mounting the connector 300 horizontally to the circuit board 200 may be particularly advantageous. When the circuit board 200 and the connector 300 are mounted horizontally, the flat upper surface 312 is exposed such that it is easily accessible by a suction tool. For example, a suction tool can attach to the flat upper surface 312 (which can be one of the relatively largest surfaces of the connector) and position the connector 300 relative to the surface of the circuit board. Such an assembly process can be relatively simpler that when the connector is mounted vertically because additional equipment may be required to orient the connector vertically with respect to the circuit board.

The connection portion 308 of the connector 300 can include features for attaching the connector 300 to the circuit board 200. Such features may establish mechanical and electrical connections. In the illustrated embodiment, the connection portion 308 includes tabs 314. As illustrated, one tab 314 can be positioned on each lateral side of the connection portion 308 of the connector 300. That tabs 314 can provide a surface for connecting the connection portion 308 of the connector to the circuit board 200 (see, for example, FIG. 10). The surface area of the tabs 314 can be relatively large in comparison to the other portions of the connector 300 that are connected to the circuit board 200. The tabs 314 may provide or help provide a strong mechanical connection between the connector 300 and the circuit board 200. In the illustrated embodiment, the tabs 314 include openings 316. In some embodiments, one or more features of the housing 150 can engage with the tabs 314 and/or openings 316 to facilitate the mechanical connection of the connector 300 to the circuit board 200 (see, for example, FIG. 16, described below). The connection portion 308 may also include a hole or recess 318 formed on an upper surface thereof. One or more features of the housing 150 can engage with the hole or recess 318 to facilitate the mechanical connection of the connector 300 to the circuit board 200.

Figure 10:
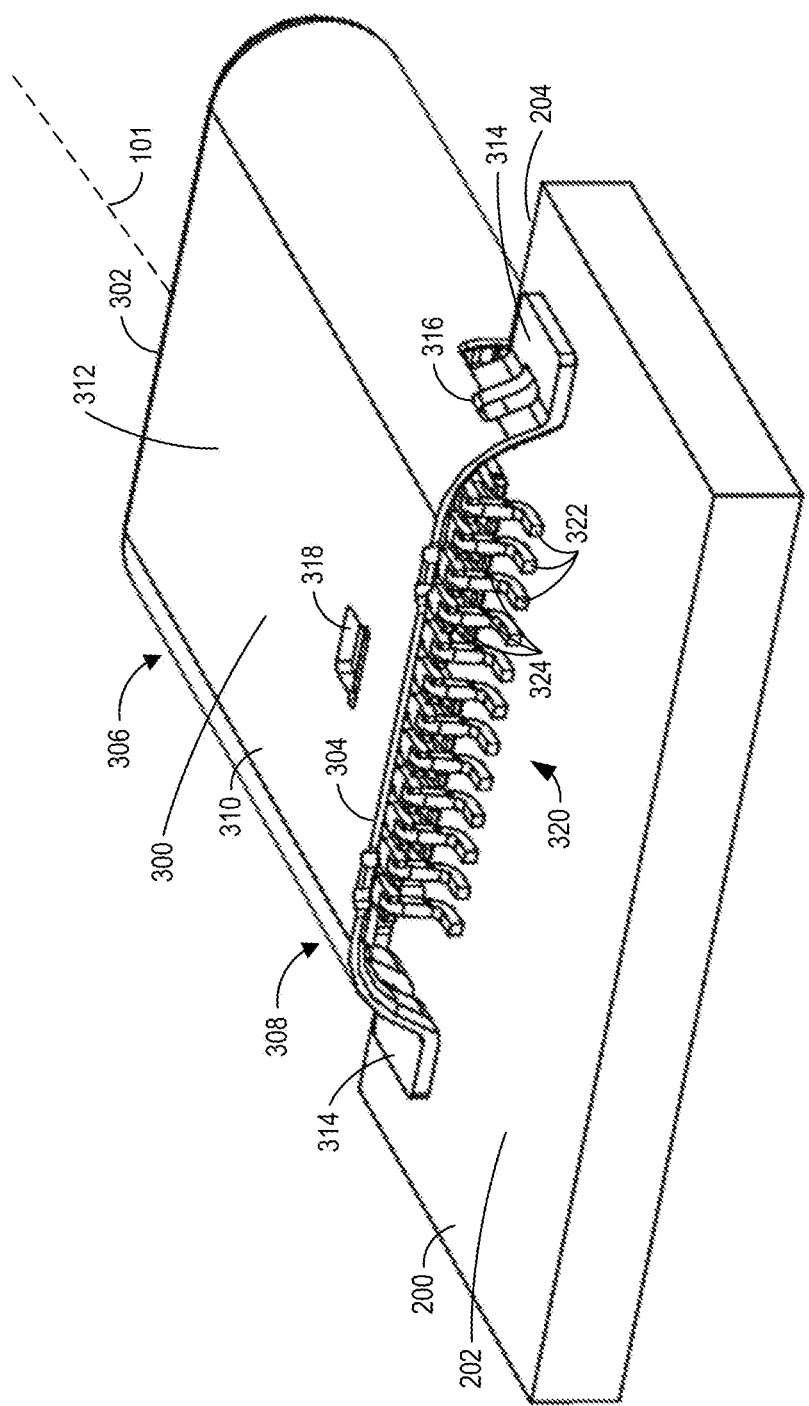
FIG. 10 is a perspective view of the connector of FIG. 5 horizontally mounted to the circuit board of FIG. 8.
Figure 15:
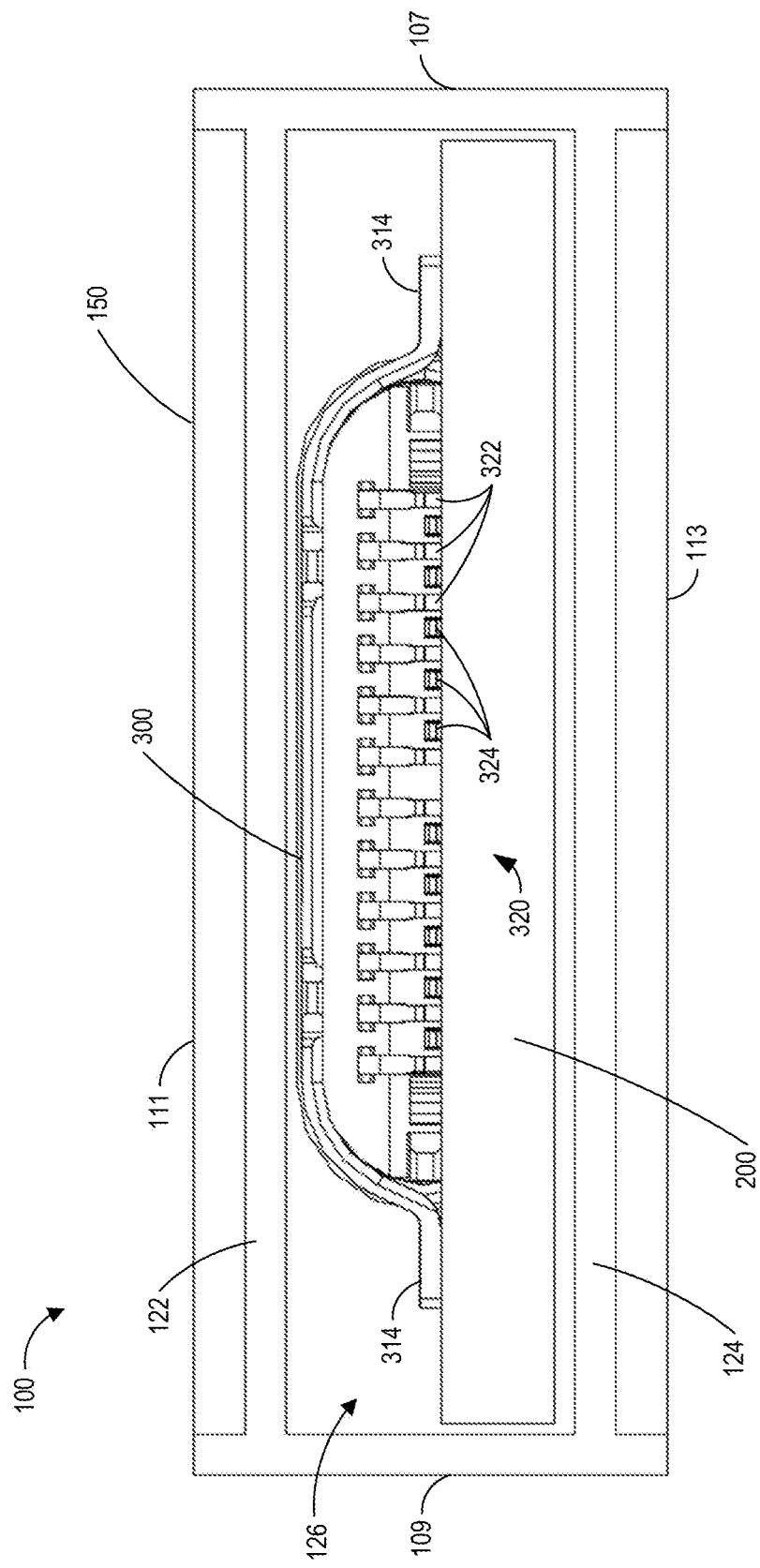
FIG. 15 is a cross-sectional view of the storage device of FIG. 1 taken along the plane B-B shown in FIG. 3.

Proximal ends of pins 320 can be positioned at the connection portion 308 of the connector 300. The pins 320 can extend from the proximal ends at the connection portion 308 to distal ends (not shown) in the insertion portion 306. The pins 320 can establish an electrical connection between the circuit board 200 and the electronic device to which the storage device 100 is connected. As best shown in FIGS. 6, 10, and 15, the connector 300 may comprise twenty two pins 320. In some embodiments, use of twenty two pins 320 may allow for full utilization of the USB 3.1 protocol. The USB 3.1 protocol may require at least twenty two pins transfer data at full speed (up to 10 gigabits per second (Gbps)). Many existing USB Type-C devices include only thirteen pins. With thirteen pins, a USB type-C device is only capable of data transfer at half speed (up to 5 Gbps). Many existing USB type-C devices have used thirteen pins because it can be difficult to reliably establish a connection for all twenty two pins during manufacturing, especially for USB type-C devices that include a small form factor. In some embodiments, the storage device 100 may be configured to use only a subset of the twenty two pins 320. For example, the storage device 100 may use only fifteen of the twenty two pins 320 to transfer data. In some instances, using only a subset of the pins may result in slower data transfer (e.g., 5 Gbps.

As shown in FIGS. 6 and 10, the twenty two pins 320 of the connector 300 can be arranged in two rows. In the illustrated embodiment, a proximal row includes twelve pins 322, and a distal row of pins includes ten pins 324. As best seen in FIGS. 6 and 15, the proximal row pins 322 and the distal row pins 324 can be staggered or offset with respect to each other. This arrangement may be particularly advantageous in that it can allow for optical inspection of all twenty two pins 320 during assembly to check the coplanarity and connection of the pins 320.

FIGS. 6 and 7 illustrate example dimensions for the connector 300. These dimensions may provide the connector 300 with a configuration that is suitable for use in the storage device 100 having a small form factor. As shown in FIG. 6, the connector 300 may comprise a total length $L_c$. The length $L_c$ can be length $L_c$ can be about 12 mm, 11 mm, 10 mm, 9 mm, or 8 mm. In some embodiments, the length $L_c$ may not exceed about 12 mm, 11 mm, 10 mm, 9 mm, or 8 mm. In some embodiments, the length $L_c$ is between about 12 mm and about 8 mm, between about 11 and about 8 mm, between about 11 mm and about 9 mm, or between about 11 mm and about 9.5 mm. In an embodiment, the length $L_c$ can be 11.0 mm. In an embodiment, the length $L_c$ can be 9.5 mm.

The connector 300 can comprise a total thickness $T_c$ as shown in FIG. 7. The thickness $T_c$ can be determined based upon the connector specifications for the connector 300. For example, the thickness $T_c$ can be configured to engage with a corresponding port of a similar type. In the case of the type-C USB connector, as illustrated, the thickness $T_c$ can be 2.4 mm.

At the connection portion 308, the connector 300 can comprise a thickness that is reduced by an offset thickness $T_o$, and a length that is reduced by an offset length $L_o$ as shown in FIG. 7. The offset thickness $T_o$ and the offset length $L_o$ provide space for receiving a portion of the circuit board 200 as shown, for example, in FIG. 14.

The offset thickness $T_o$ can be for example, about 1.5 mm, 1.3 mm, 1.1 mm, 0.9 mm, or 0.7 mm. In some embodiments, the offset thickness $T_o$ is at least about 1.5 mm, 1.3 mm, 1.1 mm, 1 mm, 0.9 mm, or 0.7 mm. In some embodiments, the offset thickness $T_o$ is between about 1.5 mm and about 0.7 mm or between about 1.3 and about 1.9 mm. In an embodiment, the offset thickness $T_o$ can be 1.1 mm. In some embodiments, the offset thickness $T_o$ can be approximately equal to a thickness $T_b$ of the circuit board 200 (see FIG. 9).

Figure 14:
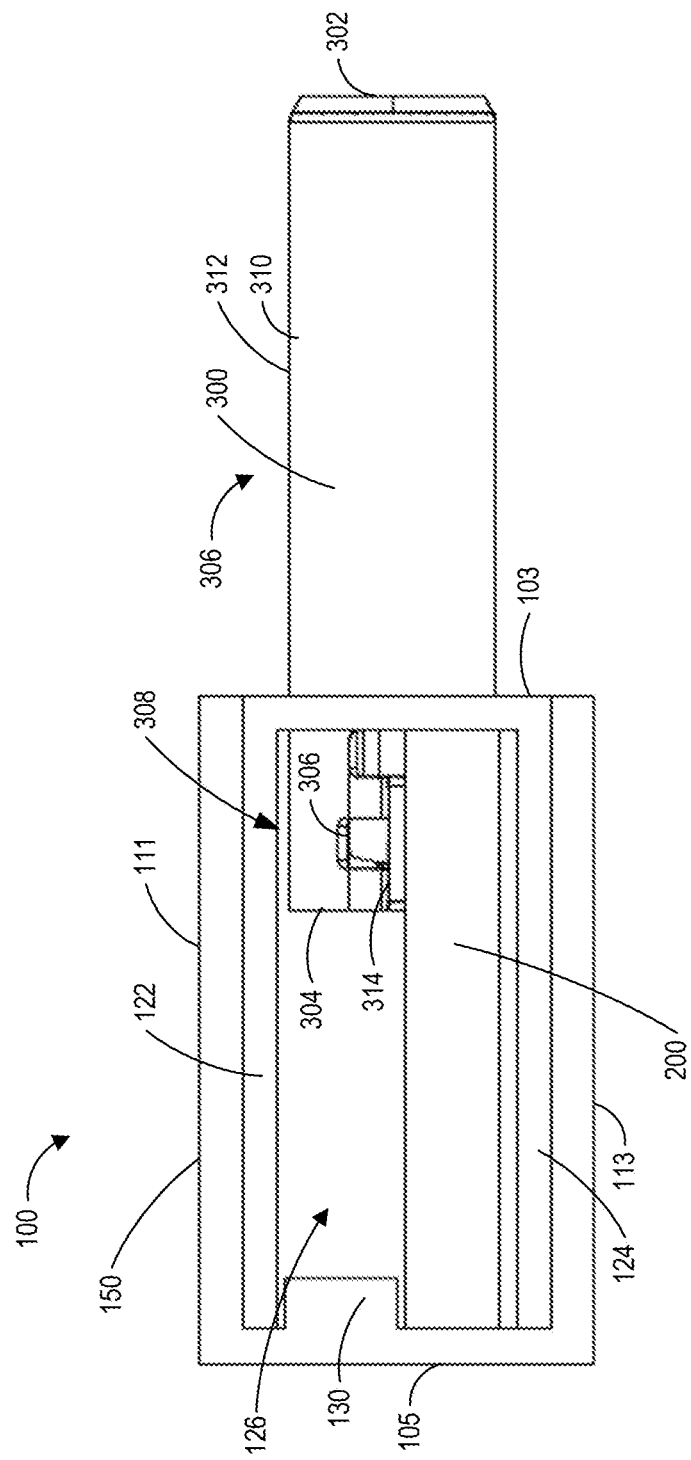
FIG. 14 is a cross-sectional view of the storage device of FIG. 1 taken along the plane A-A shown in FIG. 2.

Previous horizontal mount type-C USB connectors generally have included a much smaller offset thickness $T_o$. For example, an offset thickness $T_o$ of about 0.52 mm is common for previously known connectors. The smaller offset thickness of previously known connectors was generally included because a smaller offset thickness increases the thickness of the connector/connection portion, which can result in a simpler structure (for example, providing more room for connections to distal ends of the pins). However, the storage device 100 includes the connector 300 with a larger offset thickness $T_o$ as described above, as such a larger offset thickness $T_o$ can contribute to an overall smaller for factor for the storage device 100. For example, as the offset thickness $T_o$ increases, the centerline for the connector 300 can become closer to the center line for the circuit board 200, reducing the overall thickness of the storage device 100. In contrast, for previously known connectors with smaller offset thicknesses, the connector generally sits above the circuit board. With a larger offset thickness $T_o$ as described above, the connector 300 can be more aligned with the circuit board 200. In some embodiments, the centerline of the connector 300 can be substantially aligned with a top surface of the circuit board 200, as shown in FIG. 14.

Further, in some embodiments, the increased offset thickness $T_o$ allows the circuit board 200 to be fitted entirely or substantially entirely within the thickness of the $T_c$ of the connector 300. For example, as shown in FIG. 14, the bottom surface of the circuit board 200 is approximately in line with the bottom surface of the connector 300.

As shown in FIG. 7, the offset length $L_o$ can be about 3 mm, 2.5 mm, 2 mm, or 1.5 mm. In some embodiments, the offset length $L_o$ may not exceed about 3 mm, 2.5 mm, 2 mm, or 1.5 mm. In some embodiments, the offset length $L_o$ is between about 3 mm and about 1.5 mm or between about 2.5 and about 1.5 mm. In an embodiment, the offset length $L_o$ can be 2.1 mm.

The offset thickness $T_o$ and the offset length $L_o$, having dimensions as described above, can be configured to strengthen the mechanical connection between the connector 300 and the circuit board 200. For example, by increasing the offset thickness $T_o$ a larger surface area 328 of the connector 300 (see FIG. 7) can contact the side of the circuit board 200. This contact can facilitate transmission of forces and torques between the connector 300 and the circuit board. The offset length $L_o$ can provide similar functionality with respect to the surface area 330 of the connector 300, which contacts a top surface of the circuit board 200.

Figure 8:
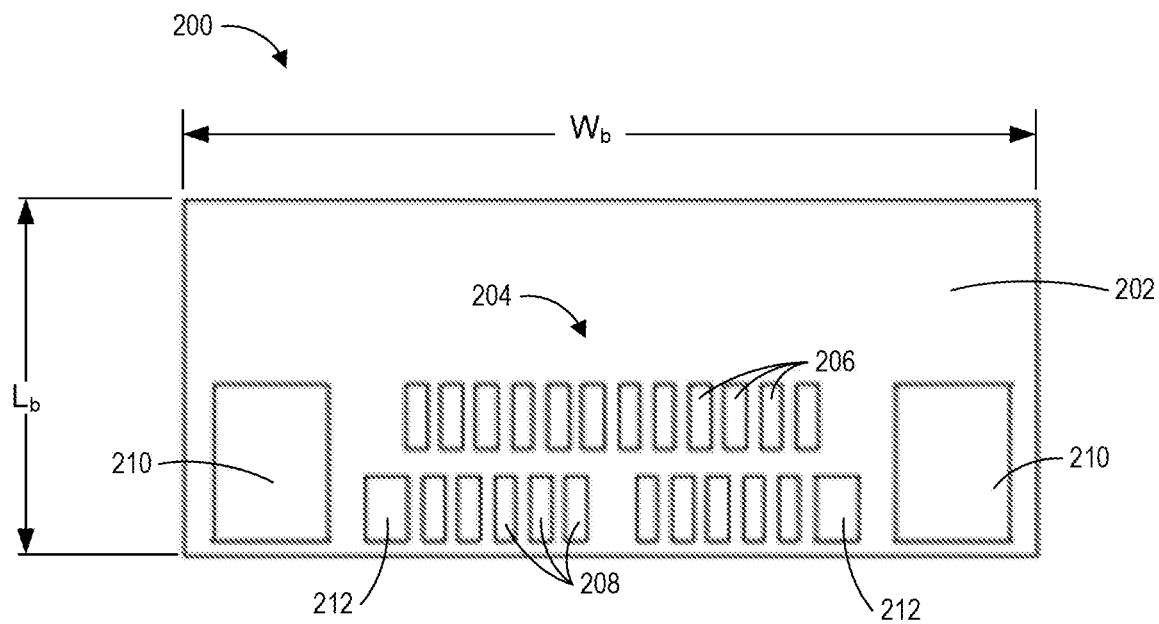
FIG. 8 is a top view of an embodiment of the circuit board of the storage device of FIG. 1.
Figure 9:
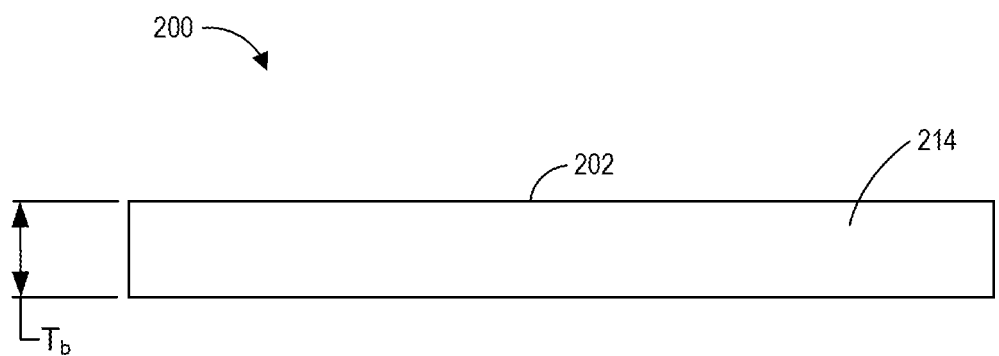
FIG. 9 is a front view of the circuit board of FIG. 8.

FIGS. 8 and 9 illustrate top and front views, respectively, of the circuit board 200. As shown in FIG. 8, the circuit board 200 includes a first surface 202 (e.g., a top surface of the circuit board). The connection portion 308 of the connector 300 can be configured to attach to the first surface 202. As illustrated, the first surface 202 includes pads 204 for connecting to the pins 320 of the connector 300. In the illustrated embodiment, the circuit board 200 includes twenty-two pads 204 for connecting to the twenty two pins 320. The pads 204 can comprise a proximal row of pads 206 and a distal row of pads 208. In the illustrated embodiment, twelve proximal pads 206 and ten distal pads 208 are included to connect to the twelve proximal pins 322 and ten distal pins 324. The pads 204 can comprise solder pads for connecting to the pins 320 of the connector.

The first surface 202 of the circuit board 200 also includes mounting pads 210. In the illustrated embodiment, two mounting pads 210 are included on the first surface 202. The mounting pads 210 can be configured to connect to the tabs 314 of the connection end 308 of the connector 300. The mounting tabs 210 can provide a large surface area for connecting the tabs 314 so as to facilitate a strong mechanical connection between the connector 300 and the circuit board 200. The first surface 202 can also include additional pads 212. In the illustrated embodiment, two additional pads 212 are included at the outer edges of the row of distal pads 208. The pins 320 and tabs 314 of the connector 300 can be mounted to the circuit board 200 using, for example, surface-mount technology (SMT) techniques. In some embodiments, the co-planarity of the pins 320 is within 0.1 mm+/−0.05 mm, 0.1 mm+/−0.025 mm, or 0.1 mm+/−0.01 mm. In some embodiments, the pins 320 can be soldered to the circuit board 200, for example, without open solder, floating pins, or bridging.

FIG. 9 illustrates a front face 214 of the circuit board 200. In some embodiments, the front face 214 of the circuit board 200 is configured to contact the surface area 328 (FIG. 7) of the connector 300 created by the offset thickness $T_o$ so as to facilitate a strong connection between the circuit board 200 and the connector 300.

Example dimensions for the circuit board 200 are shown in FIGS. 8 and 9. As shown, the circuit board 200 can include a length $L_b$, a width $W_b$, and a thickness $T_b$ as shown. Because the connector 300 is horizontally mounted to the circuit board 200, the length $L_b$ of the circuit board 200 contributes to the overall length that the storage device 100 protrudes from the electronic device to which it is connected. Minimizing the length $L_b$ can contribute to the small form factor of the storage device. In some embodiments, the length $L_b$, may be about 11 mm, 9 mm, 7 mm, or 5 mm. In some embodiments, the length $L_b$, may not exceed about 11 mm, 9 mm, 7 mm, or 5 mm. In some embodiments, the length $L_b$, is between about 11 mm and about 5 mm, between about 9 and about 5 mm, or between about 7 mm and about 5 mm.

The width $W_b$ can be about 16 mm, 14 mm, 12 mm, or 10 mm. In some embodiments, the width $W_b$ may not exceed about 16 mm, 14 mm, 12 mm, or 10 mm. In some embodiments, the width $W_b$ is between about 16 mm and 10 mm, between 18 mm and 10 mm, or between 16 mm and 10 mm.

As shown in FIG. 9, the thickness $T_b$ can be measured between the third side 111 and the fourth side 113. In some embodiments, the thickness $T_b$ may be about 1.4 mm, 1.2 mm, 1 mm, 0.8 mm, or 0.6. In some embodiments, the thickness $T_b$ may not exceed about 1.4 mm, 1.2 mm, 1 mm, 0.8 mm, or 0.6. In some embodiments, the thickness $T_b$ is between about 1.4 mm and 0.8 mm or between 1.2 mm and 0.8 mm. In an embodiment, the thickness $T_b$ is about 1 mm.

The circuit board 200 can include the circuitry and other electronic components of the storage device 100. In some embodiments, the circuit board 200 is a system-in-package (SiP). A SiP can comprise a plurality of integrated circuits enclosed in a single module (or package). The SiP can perform all or most of the functions of the storage device 100 (e.g., reading, writing, and storing data). The SiP can include a plurality of dies containing integrated circuits. The dies may be stacked vertically on a substrate. The dies can be internally connected by fine wires that are bonded to the module. Alternatively, solder bumps can be used to join stacked dies together. In some embodiments, the dies can be stacked horizontally.

The circuit board 200 need not comprise a SiP in all embodiments. For example, in some embodiments, the circuit board 200 comprises a printed circuit board (PCB). In some embodiments, both a SiP and a PCB may be utilized. In certain embodiments, use of a SiP may be advantageous, as a SiP may provide an all-in-one small package which can be useful for decreasing the overall size or form factor of the storage device 100.

As shown in FIG. 10, the circuit board 200 (a SiP, for example) includes the upper surface 202. In some embodiments, the connector 300 mounts flushly with the upper surface 202, such that components of the connector 300 do not extend through the upper surface 202 and into or through the circuit board 200. This may be the case where (as illustrated) the circuit board 200 comprises a SiP. In some embodiments, the SiP is configured such the connector 300 may be mounted to only a single side (e.g., the upper surface 202) thereof.

Figure 11:
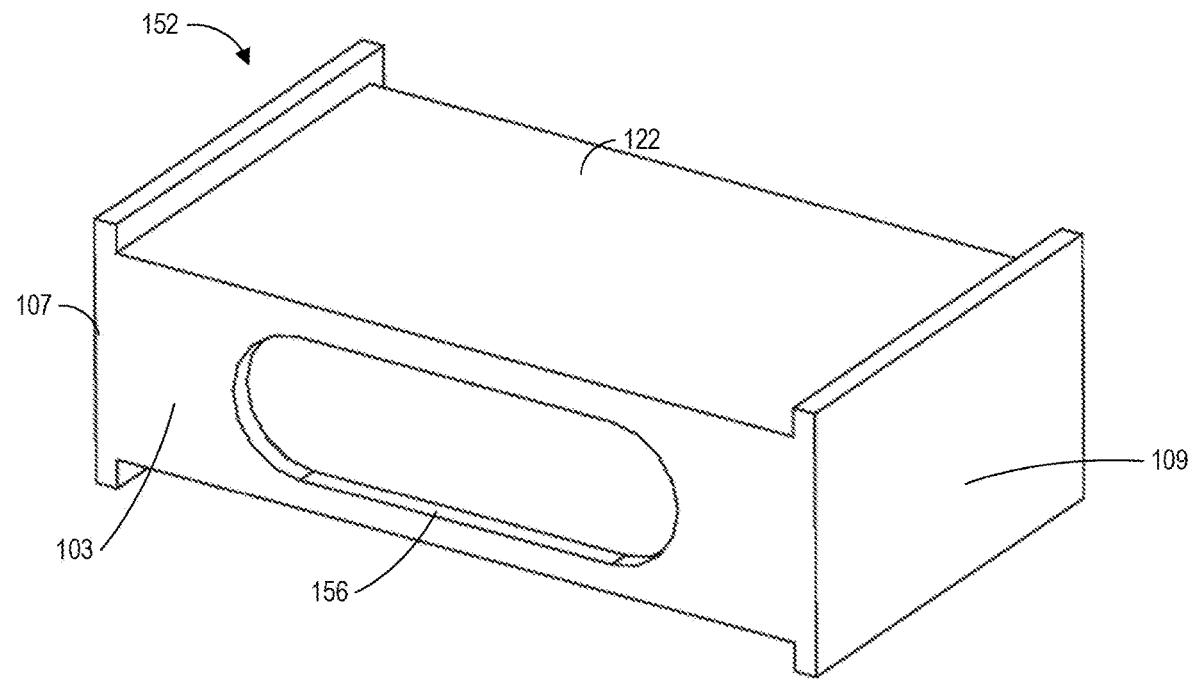
FIG. 11 is a first perspective view of an embodiment of the first housing component of the storage device of FIG. 1.
Figure 12:
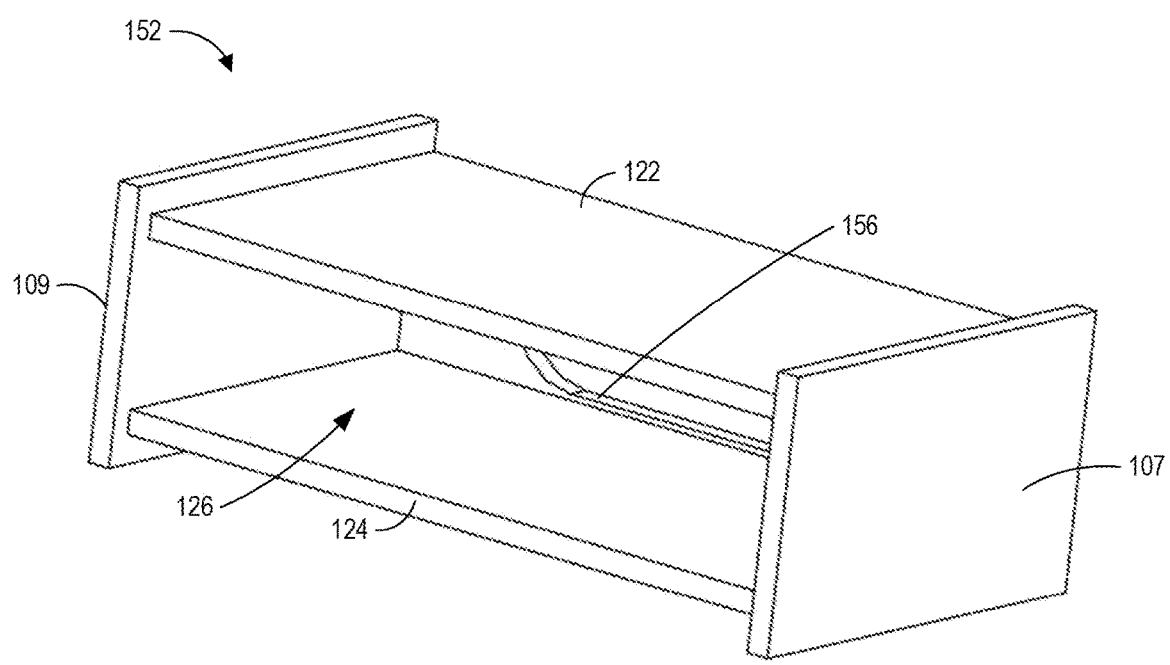
FIG. 12 is a second perspective view of the first housing component of FIG. 11.
Figure 16:
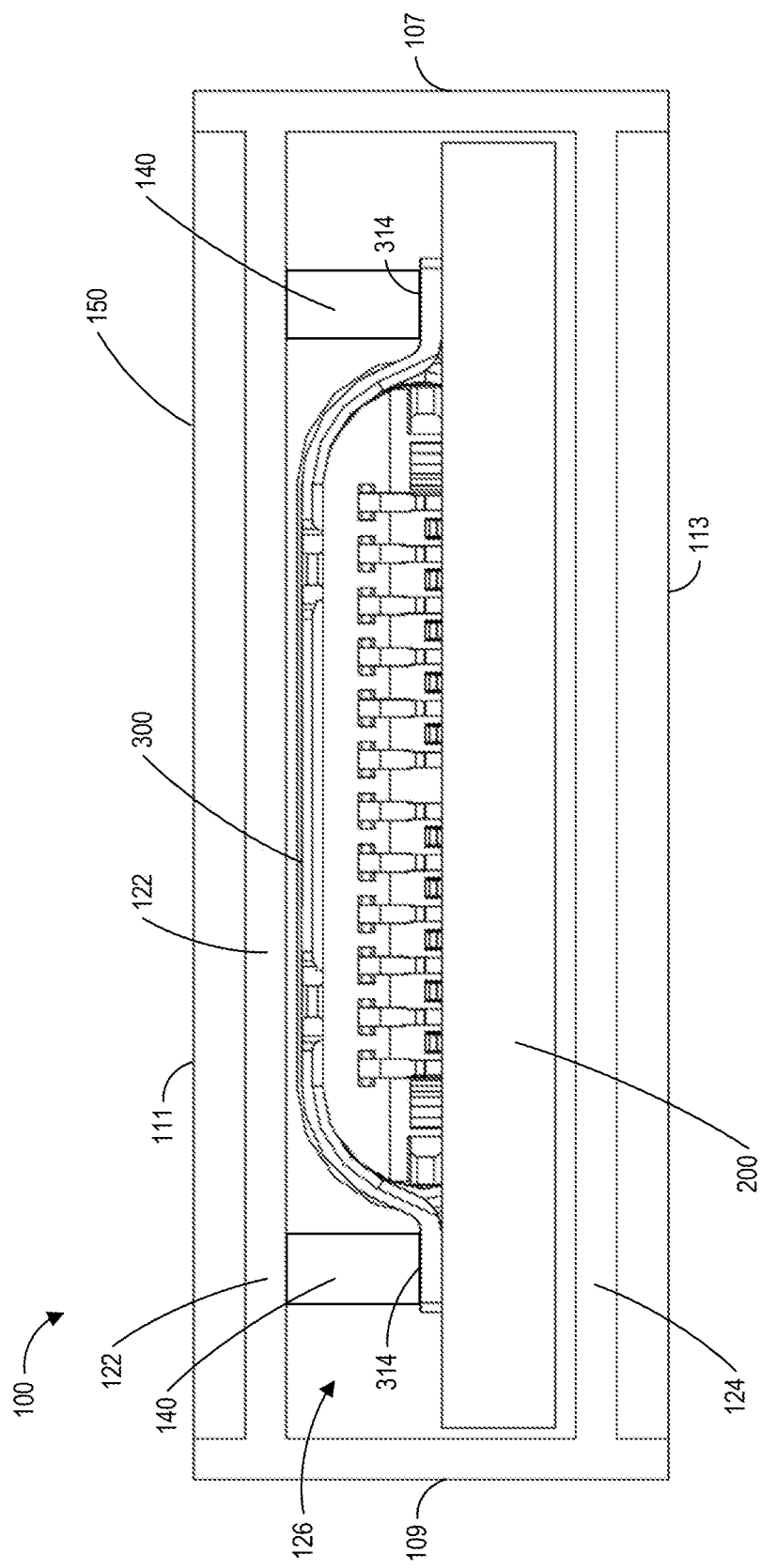
FIG. 16 is another cross-sectional view of the storage device according to another embodiment.

FIG. 11 is a first perspective view and FIG. 12 is a second perspective view of an embodiment of the first housing component 152 of the storage device 100. In the illustrated embodiment, the first housing component 152 comprises the inner side 103 and the first and second (e.g., left and right) sides 107, 109 of the housing 150. The aperture 156 is formed in the inner side 103. As best seen in FIG. 12, the first and second sides 107, 109 are connected by top and bottom bridging walls 122, 124. A space 126 is formed between the top and bottom bridging walls 122, 124. As shown in FIGS. 14-16, the circuit board 200 and connecting portion 308 of the connector 300 can be received within the space 126 between the bridging walls 122, 124 when the storage device 100 is assembled. As will be described below, the distance between the top and bottom bridging walls 122, 124 can be configured such that the clearance between the circuit board 200 and the bottom bridging wall 127 and the connector 300 and the top bridging wall 122 is minimized so that forces and torques can be transferred therebetween to strengthen the mechanical connection between the connector 300 and the circuit board 200 and facilitate heat transfer between circuit board 200 and the first housing component 152.

In some embodiments, the first housing component 152 is die cast of a metal material. Die casting the first housing component 152 of a metal material may strengthen the first housing component 152 such that it can absorb forces and torques imparted on the storage device 100 while maintaining small wall thicknesses (e.g., wall thicknesses of about 0.3 mm or about 0.4 mm). Further, die casting the first housing component 152 of a metal material may provide improved thermal properties for dissipating heat as discussed below. In some embodiments, the first housing component may be made from a zinc alloy. In some embodiments, the first housing component 152 need not comprise metal. For example, the first housing component 152 can be made from plastic.

Figure 13:
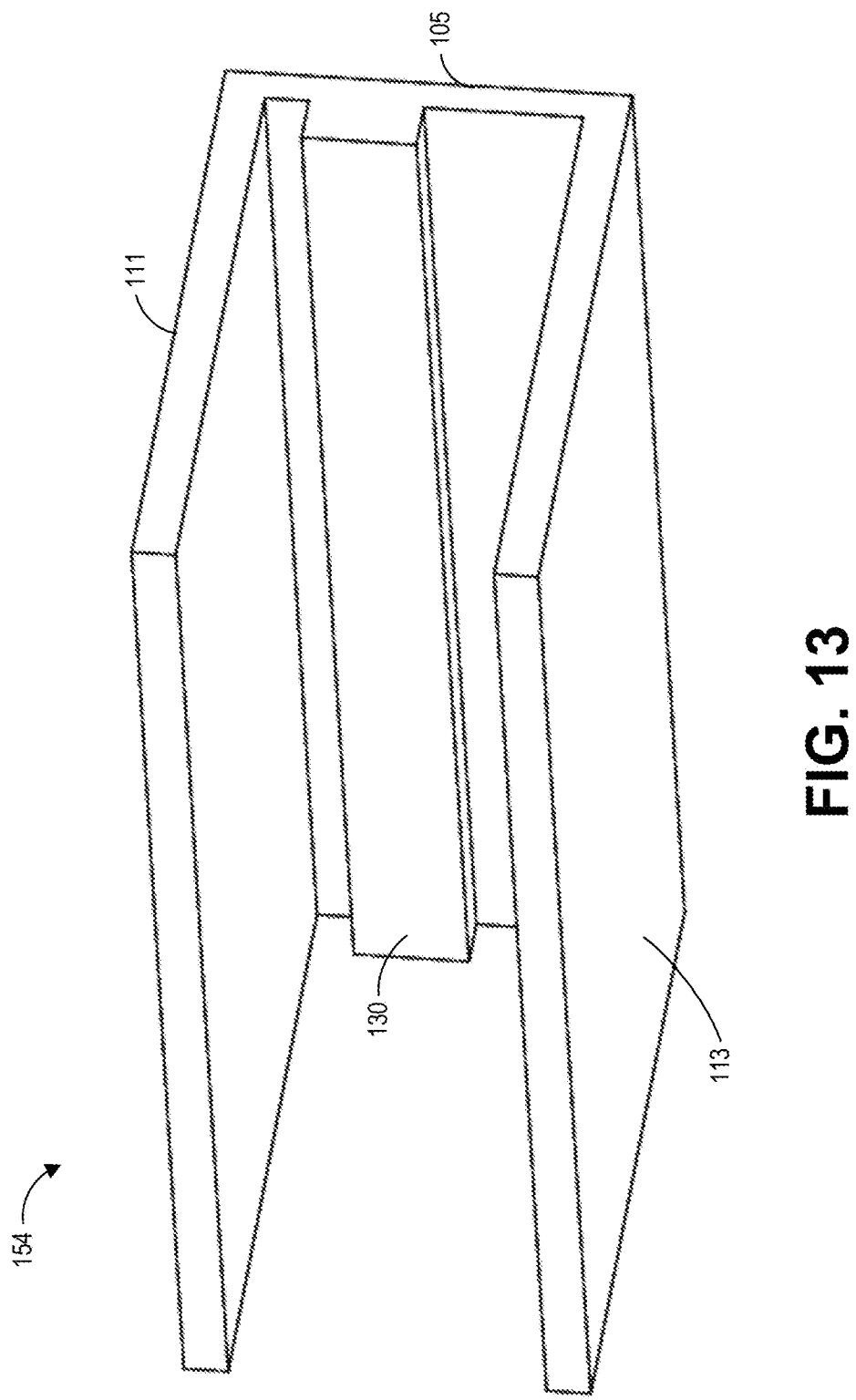
FIG. 13 is a perspective view of the second housing component of the storage device of FIG. 1.

FIG. 13 is a perspective view of the second housing component 154 of the storage device 100. In the illustrated embodiment, the second housing component 154 comprises the outer side 105, the third side 111, and the fourth side 113 of the housing 150. As shown in FIG. 13, the outer side 105, the third side 111, and the fourth side 113 of the housing 150 can be arranged generally in a U-shape. FIG. 13 also illustrates that flange a flange 130 can be formed on the inner surface of the outer side 105. As will be described below, the flange 130 can be configured to contact and support the circuit board 200 so as to strength the mechanical connection between the circuit board 200 and the connector 300.

In some embodiments, the second housing component 154 can be made from plastic. The second housing component 154 can be made from a heat isolative material. In some embodiments, the second housing component 154 can be made from a thermoplastic elastomer (TPE) material. Other materials are also possible.

FIG. 14 is a cross-sectional view of the storage device 100 taken along the plane A-A shown in FIG. 2. As shown, the circuit board 200 and connection portion of the connector 300 are positioned within the space 126 of the first housing component 152, between the bridging walls 122, 124. An end of the circuit board 200 is positioned between the flange 130 of the second housing component 154 and the bridging wall 124.

FIG. 15 is a cross-sectional view of the storage device 100 taken along the plane B-B shown in FIG. 3. As shown in FIGS. 14 and 15, gaps between the circuit board 200 and the bridging wall 124 and gaps between the connection portion 306 of the connector and the bridging wall 122 are small (e.g., less than 0.3 mm, less than 0.2 mm, or less than 0.1 mm). This arrangement can limit play between the circuit board 200 and connector 300 and the housing 150 so as to strengthen the mechanical connection between the circuit board 200 and the connector 300.

For example, with reference to FIG. 4, if the distal end 302 of the connector 300 is torqued downward, the circuit board 200 is prevented from lifting substantially upward by contact between the circuit board 200 and the flange 130 and contact between the connection portion 308 and the bridging wall 122. This contact can help to distribute and absorb the forces and torques into the housing 150, thereby reducing the stresses between the connection portion 308 of the connector 300 and the circuit board. Similarly, if the distal end 302 of the connector is pushed upward, contact between the circuit board 200 and the bridging wall 124 can absorb and distribute the stresses.

FIG. 16 is another cross-sectional view of the storage device 100 according to another embodiment. In this embodiment, the first housing component 152 can include bodies 140 that project laterally downward from the bridging wall 122. The bodies 140 can be positioned over the tabs 314 of the connector 300. The bodies 140 can press the tabs 314 down into the circuit board 200 to further strengthen the mechanical connection therebetween.

As noted previously, the storage device 100 can be configured to dissipate heat generated by the circuit board 200 during operation. During use, the components of the circuit board 200 can generate heat that should be dissipated in order to prevent damage to the storage device 100. Because the storage device 100 can comprise a small form factor as described above, the storage device 100 may not comprise sufficient surface area from which to dissipate heat. Accordingly, in some embodiments, the storage device 100 is configured to dissipate heat to the electronic device to which it is connected. The electronic device can serve as a heat sink for the storage device 100.

For example, as noted above, the first housing component 152 can be made from metal or another thermally/heat conductive material. The bridging walls 122, 124 of the first housing component 152 can be in close proximity to the circuit board 200 such that heat generated by the circuit board 200 can be absorbed by the bridging walls 122, 124. The bridging walls 122, 124 can transmit the heat to the inner side 103 of the housing 150. In some embodiments, the inner side 103 is configured to contact the electronic device to which the storage device 100 is attached. As illustrated, for some embodiments, the inner side 103 can be configured to be flat or planar. This may facilitate contact with a side of the electronic device to which the storage device 100 is attached. Thus, heat can be transmitted from the inner side 103 to the electronic device 100 from which it can be dissipated.

Because the first housing component 152 can be configured to absorb heat, the second housing component 154 can be configured to provide an insulative cover over the bridging walls 122, 124 to reduce the likelihood of burning a user.

Figure 17:
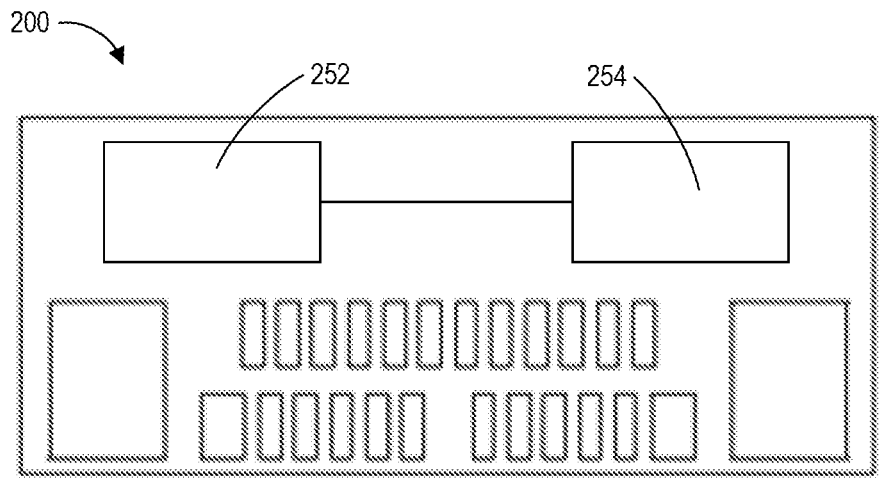
FIG. 17 illustrates an embodiment of a circuit board for the storage device of FIG. 1 including a temperature sensor and data transfer rate controller.
Figure 18:
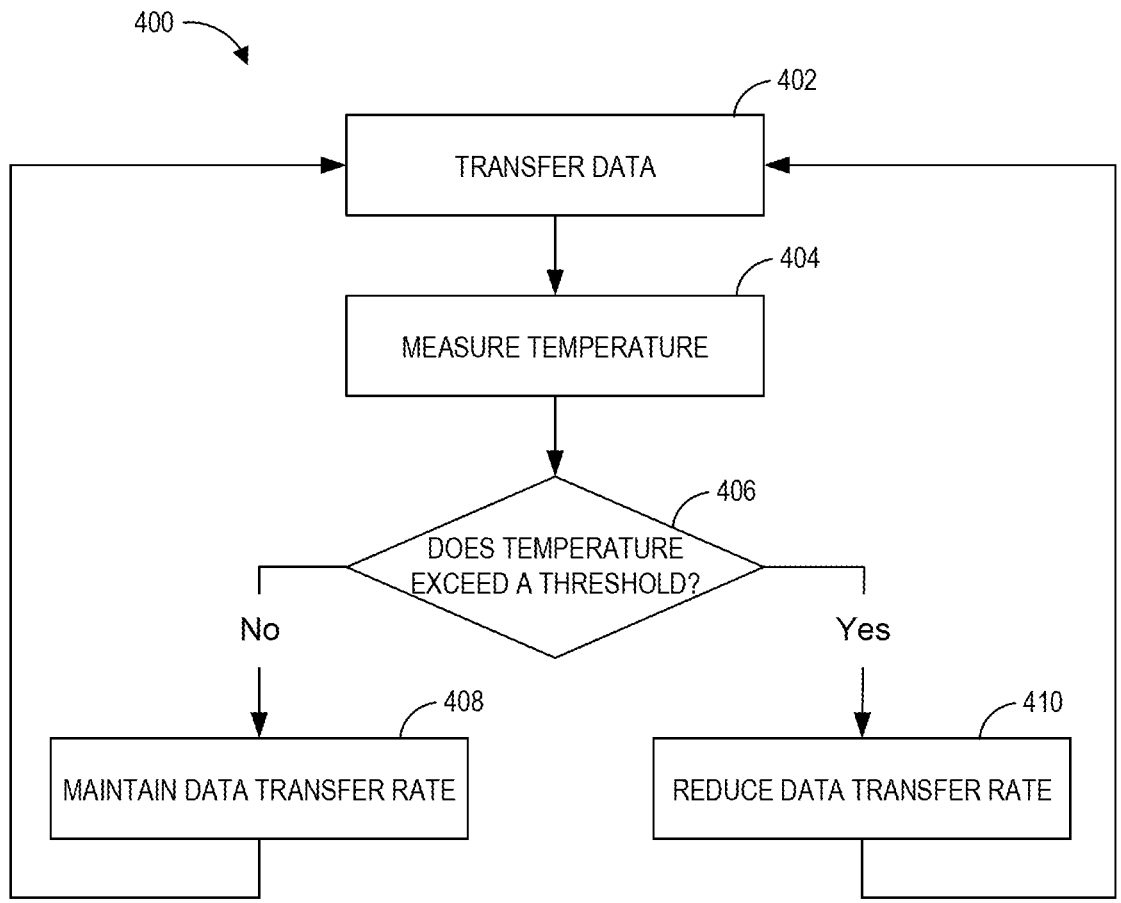
FIG. 18 is a flowchart illustrating a method for temperature-based data transfer.

FIGS. 17 and 18 describe additional features that can be included in the storage device 100 to manage the heat generated by the circuit board 200. FIG. 17 illustrates an embodiment of a circuit board for the storage device of FIG. 1 including a temperature sensor 252 and data transfer rate controller 254. The temperature sensor 252 can be configured to measure the temperature of the circuit board 200. The data rate transfer controller 254 can be configured to reduce a data transfer rate of the storage device 100 if the measured temperature exceeds a threshold value.

FIG. 18 is a flowchart illustrating a method 400 for temperature-based data transfer. The method 400 may be implemented by the circuit board 200 of FIG. 17 of the storage device 100. In some embodiments, the method 400 is implemented during data transfer to or from the storage device 100.

The method 400 begins at block 402 at which data is transferred to or from the storage device. At block 404, during the data transfer, the temperature of the circuit 200 board can be measured using the temperature sensor 252. Next, the method 400 moves to a decision state 406, at which the method 400 determines if the measured temperature exceeds a threshold.

If the measured temperature does not exceed the threshold, the method 400 moves to block 408, at which the data transfer rate is maintained. If the measured temperature exceeds the threshold, the method 400 moves to block 410, at which the data transfer rate is reduced. Reducing the data transfer rate can lower the temperature of the circuit board 200 to avoid damage. The method 400 can run as a loop during data transfer such that the data transfer rate can be continually adjusted to maintain fast data transfer rates while avoiding overheating.

In some embodiments, the present disclosure generally relates to, for example, a type-C USB (Universal Serial Bus) memory drive or storage device with small size. The storage device can be configured for plug and stay use. The storage device can include one or more of the following: a USB type-C connector with leads extending along the direction of insertion of the storage device; a USB SiP (System-In-Package) or other type of circuit board positioned within a housing, a BGA (Ball Grid Array) in which the memory dies, controller die(s) and spacer are stacked, and on one side of which the BGA is formed for connections to type-C connector and passive components; an interface PCB (Printed Circuit Board) with simple and thin design, on a first side of which the passive components from the USB SiP are mounted, on a second side of which arrays of solder balls are formed corresponding to the configuration of the USB SiP BGA, and through which through-holes may be formed corresponding to the leads of the type-C connector; a top lid and a bottom lid covering above components; wherein, the type-C connector is reflowed perpendicularly to the interface PCB with its leads passing through the through-holes in the interface PCB, and the interface PCB has the same width and length with the SiP module. In some embodiments, the SiP does not include through-holes and the connector is mounted flushly to the SiP as described above.

The foregoing description details certain embodiments of the systems, devices, and methods disclosed herein. It will be appreciated, however, that no matter how detailed the foregoing appears in text, the systems, devices, and methods can be practiced in many ways. As is also stated above, it should be noted that the use of particular terminology when describing certain features or aspects of the disclosure should not be taken to imply that the terminology is being re-defined herein to be restricted to including any specific characteristics of the features or aspects of the technology with which that terminology is associated.

It will be appreciated by those skilled in the art that various modifications and changes can be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures can be combined, interchanged or excluded from other embodiments.

With respect to the use of substantially any plural and/or singular terms herein, those having skill in the art can translate from the plural to the singular and/or from the singular to the plural as is appropriate to the context and/or application. The various singular/plural permutations can be expressly set forth herein for sake of clarity.

Directional terms used herein (e.g., top, bottom, side, up, down, inward, outward, etc.) are generally used with reference to the orientation shown in the figures and are not intended to be limiting. For example, the top surface described above can refer to a bottom surface or a side surface. Thus, features described on the top surface may be included on a bottom surface, a side surface, or any other surface.

It will be understood by those within the art that, in general, terms used herein are generally intended as "open"

terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims can contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The term "comprising" as used herein is synonymous with "including," "containing," or "characterized by," and is inclusive or open-ended and does not exclude additional, unrecited elements or method steps.

The above description discloses several methods and materials of the present invention(s). This invention(s) is susceptible to modifications in the methods and materials, as well as alterations in the fabrication methods and equipment. Such modifications will become apparent to those skilled in the art from a consideration of this disclosure or practice of the invention(s) disclosed herein. Consequently, it is not intended that this invention(s) be limited to the specific embodiments disclosed herein, but that it cover all modifications and alternatives coming within the true scope and spirit of the invention(s) as embodied in the attached claims.

What is claimed is:

1. A storage device comprising:
   a circuit board configured to store data, the circuit board including a first surface;
   a connector mounted horizontally to the first surface of the circuit board such that an insertion axis of the connector is substantially parallel to the first surface of the circuit board, the connector comprising an insertion portion configured to be inserted along the insertion axis of the connector into a port of an electronic device and a connection portion connected to the first surface of the circuit board, wherein an offset thickness between a thickness of the connection portion and a thickness of the insertion portion is at least 1 millimeter (mm); and
   a housing enclosing the circuit board and the connection portion of the connector, the insertion portion of the connector extending through an aperture in an inner side of the housing,
   wherein a length of the housing, measured between the inner side of the housing and an outer side of the housing, does not exceed 8 mm, the outer side positioned opposite the inner side along the length.

2. The storage device of claim 1, wherein:
   the circuit board comprises a thickness measured between the first surface and a second surface opposite the first surface; and
   the thickness of the circuit board is approximately equal to the offset thickness.

3. The storage device of claim 1, wherein:
   the connection portion of the connector comprises twenty-two pins attached to the circuit board; and
   the storage device is configured to transfer data at least 10 gigabits per second (Gbps) using the twenty-two pins.

4. The storage device of claim 3, wherein the twenty-two pins are connected to the circuit board in a first row comprising twelve pins and a second row comprising ten pins.

5. The storage device of claim 4, wherein the first row of pins are staggered with respect to the second row of pins such that the first row of pins and second row of pins are not aligned in a direction parallel to the insertion axis.

6. The storage device of claim 1, wherein:
   the circuit board comprises a length of about 5 mm; and
   the housing comprises a length of about 5.8 mm.

7. The storage device of claim 1, wherein:
   the circuit board comprises a length of about 7 mm; and
   the housing comprises a length of about 7.8 mm.

8. The storage device of claim 1, wherein a length of the insertion portion of the connector is about 7.4 mm.

9. The storage device of claim 1, wherein the housing comprises:
   a first housing component including the inner side of the housing and at least partially surrounding the circuit board, wherein the first housing component comprises a heat conductive material configured to transfer heat; and
   a second housing component at least partially surrounding the first housing component, the second housing component comprising a heat insulative material configured to inhibit transfer of heat.

10. The storage device of claim 9, wherein the inner side of the first housing component is configured to directly contact a surface of the electronic device to provide heat transfer between the inner side of the first housing and the electronic device.

11. The storage device of claim 9, wherein the first housing component comprises:
    a first bridging wall positioned above the connection portion of the connector; and
    a second bridging wall positioned below the circuit board.

12. The storage device of claim 11, wherein the second housing component includes a flange for securing the circuit board.

13. The storage device of claim 1, wherein the connector comprises a universal serial bus (USB) type-C connector.

14. The storage device of claim 1, wherein the circuit board comprises a system-in-package (SiP) comprising a plurality of integrated circuits.

15. A storage device comprising:
    a circuit board configured to store data, the circuit board comprising a temperature sensor configured to measure a temperature of the circuit board and a data transfer rate controller configured to control data transfer rate based on the measured temperature;

a connector mounted horizontally the circuit hoard such that an insertion axis of the connector is substantially parallel the circuit board, the connector comprising an insertion portion configured to be inserted into a port of an electronic device and a connection portion connected to the circuit board; and a housing enclosing the circuit board and the connection portion of the connector, the insertion portion of the connector extending through an aperture in an inner side of the housing, wherein a length of the housing, measured between the inner side of the housing and an outer side of the housing, does not exceed 8 millimeters (mm).

16. The storage device of claim 15, wherein an offset thickness between a thickness of the connection portion and a thickness of the insertion portion is at least 1 mm.

17. The storage device of claim 16, wherein the housing comprises:

a first housing component including e inner side of the housing and at least partially surrounding the circuit board, wherein the first housing component comprises a heat conductive material configured to transfer heat; and a second housing component at least partially surrounding the first housing component, the second housing component comprising a heat insulative material, wherein the inner side of the first housing component is configured to directly contact a surface of the electronic device to provide heat transfer between the inner side of the first housing component and the electronic device.

18. The storage device of claim 17, wherein the first housing component is die cast.

19. The storage device of claim 18, wherein the connector comprises a universal serial bus (USB) type-C connector.

20. A storage device comprising:

a storing means for storing data, the storing means comprising a top surface;

a housing means for housing the storing means; and a connector means for connecting to an electronic device to transfer data between the storing means and the electronic device, the connector means mounted horizontally to the top surface of the storing means by an attachment means, the connector means extending through an aperture of the housing means, wherein a length of the housing means, measured between an inner surface of the housing means and an outer surface of the housing means, does not exceed 8 millimeters (mm).

* * * * *